(12) United States Patent
Ahmed et al.

(10) Patent No.: US 11,908,687 B2
(45) Date of Patent: Feb. 20, 2024

(54) III-N MULTICHIP MODULES AND METHODS OF FABRICATION

(71) Applicant: Intel Corporation, Santa Clara, CA (US)

(72) Inventors: Khaled Ahmed, Anaheim, CA (US); Anup Pancholi, Hillsboro, OR (US); John Heck, Berkeley, CA (US); Thomas Sounart, Chandler, AZ (US); Harel Frish, Albuquerque, NM (US); Sansaptak Dasgupta, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/563,968

(22) Filed: Dec. 28, 2021

(65) Prior Publication Data

US 2022/0122842 A1      Apr. 21, 2022

Related U.S. Application Data

(63) Continuation of application No. 16/890,937, filed on Jun. 2, 2020, now Pat. No. 11,211,245.

(51) Int. Cl.
| | |
|---|---|
| *H01L 21/00* | (2006.01) |
| *H01L 21/02* | (2006.01) |
| *H01L 21/8234* | (2006.01) |
| *H01L 21/8222* | (2006.01) |

(52) U.S. Cl.
CPC .. *H01L 21/02458* (2013.01); *H01L 21/02389* (2013.01); *H01L 21/02452* (2013.01); *H01L 21/8222* (2013.01); *H01L 21/823418* (2013.01)

(58) Field of Classification Search
CPC ......... H01L 21/02458; H01L 21/02389; H01L 21/02452; H01L 21/8222; H01L 21/823418
See application file for complete search history.

(56) References Cited

U.S. PATENT DOCUMENTS

| | | | |
|---|---|---|---|
| 9,320,149 B2 | 4/2016 | Jin et al. | |
| 2016/0304340 A1* | 10/2016 | Meyer | ................ B81C 1/00936 |
| 2018/0190633 A1 | 7/2018 | Thompson | |

OTHER PUBLICATIONS

Notice of Allowance from U.S. Appl. No. 16/890,937 dated Sep. 2, 2021, 8 pgs.
Restriction Requirement from U.S. Appl. No. 16/890,937 dated Apr. 1, 2021, 5 pgs.

* cited by examiner

*Primary Examiner* — Richard A Booth
(74) *Attorney, Agent, or Firm* — Essential Patents Group, LLP

(57) ABSTRACT

A device includes a layer including a first III-Nitride (III-N) material, a channel layer including a second III-N material, a release layer including nitrogen and a transition metal, where the release layer is between the first III-N material and the second III-N material. The device further includes a polarization layer including a third III-N material above the release layer, a gate structure above the polarization layer, a source structure and a drain structure on opposite sides of the gate structure where the source structure and the drain structure each include a fourth III-N material. The device further includes a source contact on the source structure and a drain contact on the drain structure.

17 Claims, 14 Drawing Sheets

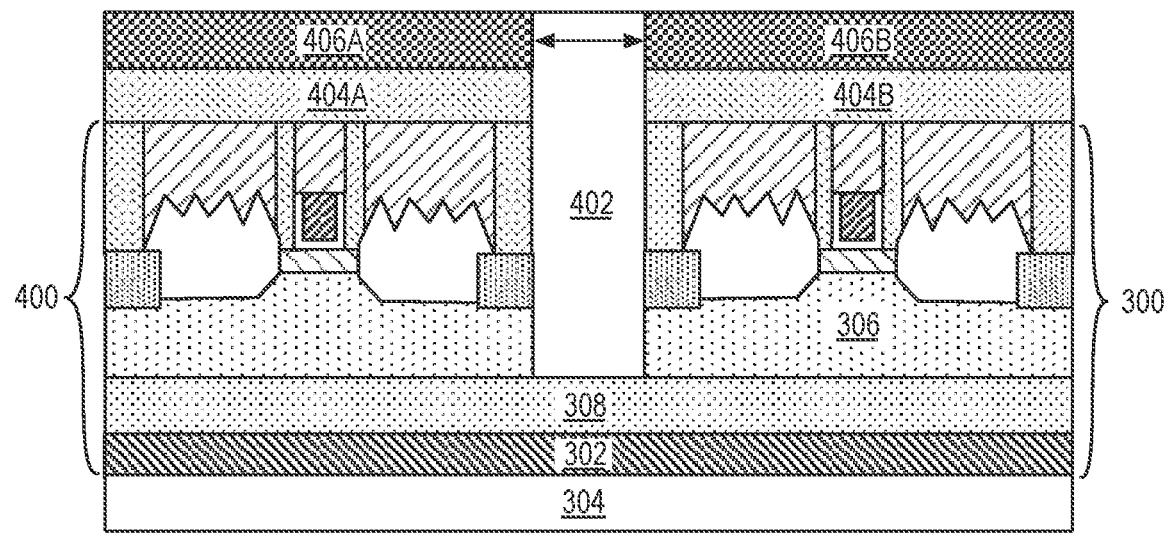
FIG. 4A
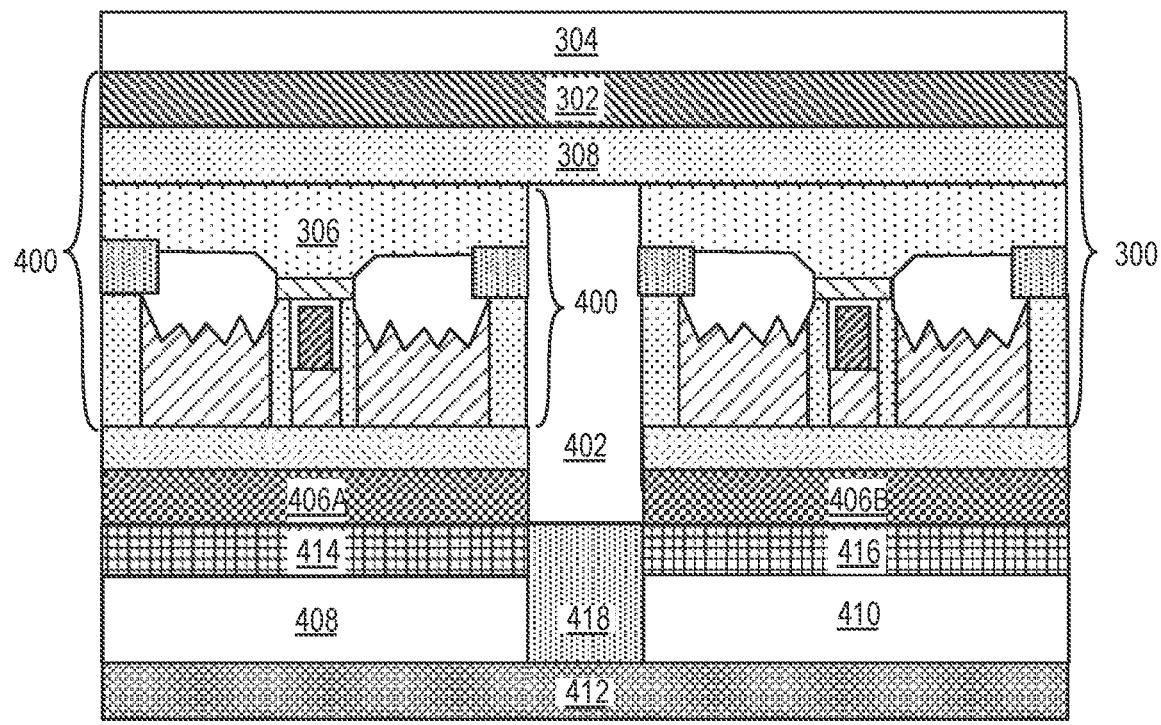
FIG. 4B
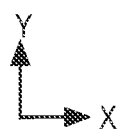

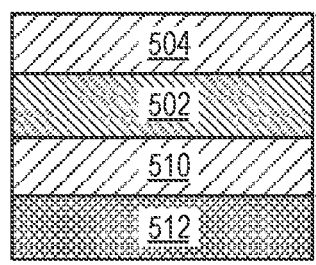
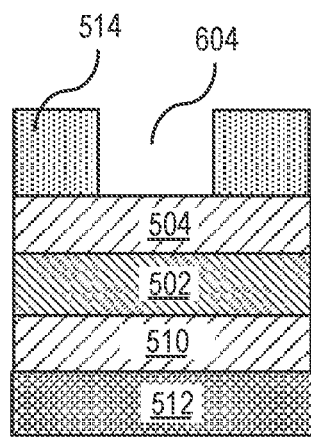
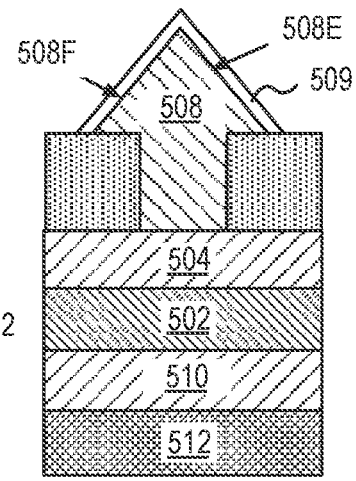
FIG. 6A     FIG. 6B     FIG. 6C
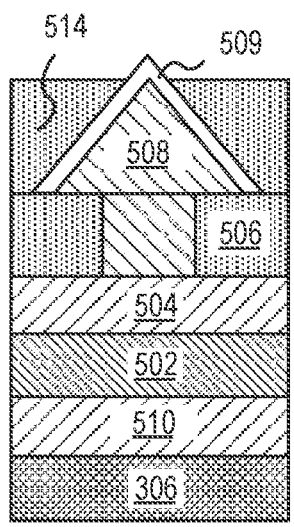
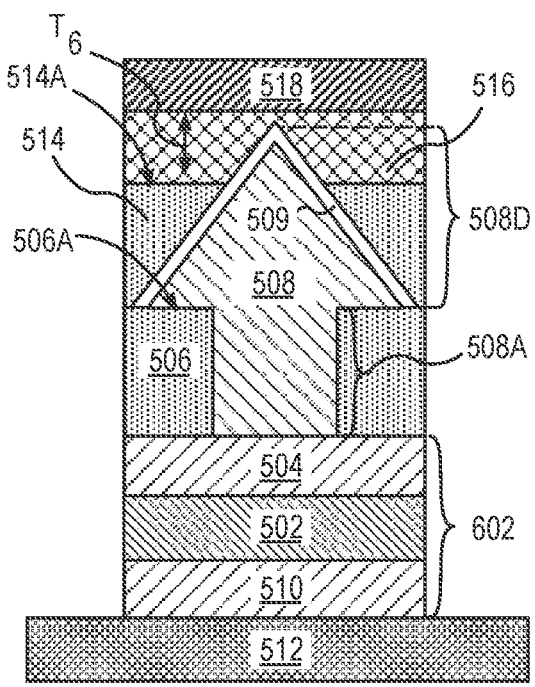
FIG. 6D     FIG. 6E

III-N MULTICHIP MODULES AND METHODS OF FABRICATION

CLAIM OF PRIORITY

This application is a continuation of, and claims the benefit of priority to, U.S. patent application Ser. No. 16/890,937, filed on Jun. 2, 2020 and titled "III-N MULTICHIP MODULES AND METHODS OF FABRICATION," which is incorporated by reference in entirety.

BACKGROUND

In the field of multichip integrated circuits various components can be assembled together through mechanical bonding and separation of multichip modules. Multichip modules can include transistors, memory devices, lasers and light emitting diodes. However, the process of transferring and combining two multichip modules from two diverse substrates via substrate bonding can be challenging. Combining and releasing a large number of multichip modules from a source substrate onto a host substrate can lead to damaged and dysfunctional devices due to abrasive post release mechanical processes and irregularity in separation, for example. Thus, manufacturing processes that utilize reliable separation between multichip modules at high throughput is highly desirable. One method that mitigates issues with separating multichip module utilizes a transparent and release layer as part of the device stack. In one or more embodiments, the release layer is removed by a variety of laser ablation methods rendering devices with structural and electrical integrity.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements.

FIG. 4A is a cross-sectional illustration of a first substrate including a first group III-N transistor and a second group III-N transistor, in accordance with an embodiment of the present disclosure.

FIG. 4B is a cross-sectional illustration of an inverted first group III-N transistor bonded with a first MOS transistor of a second substrate, and an inverted second group III-N transistor bonded with a second MOS transistor of the second substrate, in accordance with an embodiment of the present disclosure.

FIG. 6A is a cross-sectional illustration following the formation of a multilayer stack including a metal nitride layer, for fabrication of a micro-LED device, in accordance with an embodiment of the present disclosure.

FIG. 6B is a cross-sectional illustration of the structure in FIG. 6A following the process of patterning the material layer stack to form a micro LED device base.

FIG. 6C is a cross-sectional illustration of the structure in FIG. 6B following the formation of a compound semiconductor structure in an opening in a dielectric formed on the material layer stack.

FIG. 6D is a cross-sectional illustration of the structure in FIG. 6C following the formation of a dielectric on the compound semiconductor structure and following a process to recess a portion of the dielectric.

FIG. 6E is a cross-sectional illustration of the structure in FIG. 6D following the formation of an alloy layer on an uppermost surface of the dielectric and following the formation of an electrode layer on the alloy layer.

DESCRIPTION OF THE EMBODIMENTS

Figure 1:
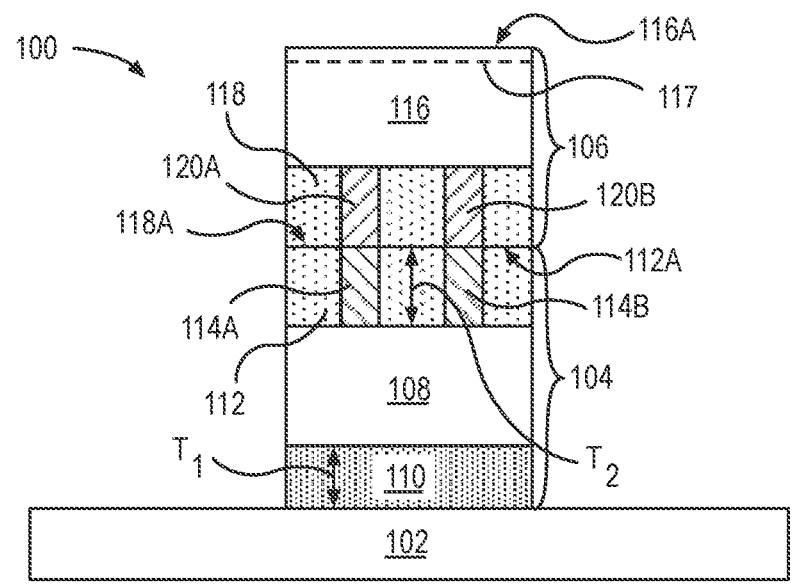
FIG. 1 is a cross-sectional illustration of a stacked chiplet, where the stacked chiplet includes an inverted first chiplet on a second chiplet, in accordance with embodiments of the present disclosure.

Group III-N stacked device structures methods of fabrication are described. In the following description, numerous specific details are set forth, such as structural schemes and detailed fabrication methods in order to provide a thorough understanding of embodiments of the present disclosure. It will be apparent to one skilled in the art that embodiments of the present disclosure may be practiced without these specific details. In other instances, well-known features, such as operations associated with group III-N transistor, are described in lesser detail in order to not unnecessarily obscure embodiments of the present disclosure. Furthermore, it is to be understood that the various embodiments shown in the Figures are illustrative representations and are not necessarily drawn to scale.

In some instances, in the following description, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical, electrical or in magnetic contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies. As used throughout this description, and in the claims, a list of items joined by the term "at least one of" or "one or more of" can mean any combination of the listed terms.

The term "adjacent" here generally refers to a position of a thing being next to (e.g., immediately next to or close to with one or more things between them) or adjoining another thing (e.g., abutting it).

The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

As used throughout this description, and in the claims, a list of items joined by the term "at least one of" or "one or more of" can mean any combination of the listed terms.

Unless otherwise specified in the explicit context of their use, the terms "substantially equal," "about equal" and "approximately equal" mean that there is no more than incidental variation between two things so described. In the art, such variation is typically no more than +/−10% of a predetermined target value.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Conventional multichip modules may comprise a plurality of integrated circuit devices wired together through a supporting passive substrate. However, such multichip modules or chiplets may be formed on different substrates but assembled together onto a single substrate. It is highly desirable for some applications that chiplets, including devices made from different material systems, be integrated for combining power and performance features. For example, GaN-based devices (e.g. HEMTs) which are more power efficient than silicon-based devices may be integrated with high performance CMOS transistors for power management integrated circuits (PMIC) applications. To enable such integration direct chip-on-chip hybrid bonding of GaN-based chips with silicon-based chips may be required.

Some methods utilize wafer bonding techniques to combine a first with a second substrate. In some embodiments, prior to bonding upper most layer of the first and of the second substrate are plasma activated or ion implanted. The uppermost layer of each substrate may include a dielectric, for example. After plasma activation or ion implantation, the first and second substrates are bonded together forming an interface between the dielectric of each substrate. Bonding may involve heating the substrates to a variety of temperatures depending on materials of the upper most layers. The heating process may advantageously cause the upper most layers to coalesce. The first and second substrates may be separated by initiating a wafer-cleaving process at a point parallel to surfaces of the first and second substrates. The cleaving process (utilizing mechanical energy) may be performed along a layer above the point of contact between the first and second substrates. The location where the cleave takes place can be engineered, for example, by forming a layer that may be cleavable above active devices of the source substrate (where the source substrate is inverted relative to the host substrate). Mechanical energy maybe used instead of or in addition to thermal energy to split the substrate.

Hybrid bonding between a first substrate including GaN-based chips with a second substrate including silicon-based chips may involve bonding not only dielectric-dielectric but also between metal-metal in interconnects within a dielectric on the first and second substrates. A variety of surface treatment/activation processes, variations in anneal temperatures, and adhesives may be utilized in the hybrid bonding process. However, the cleaving process may utilize a mechanical force and/or thermal process to split the two substrates apart. In one example, the silicon-based chips are on a host substrate and the GaN-based chips are on a source substrate. In some such examples, the bonding process attaches GaN-based chips on to the substrate containing the silicon-based chips, rendering the GaN-based chips as donated devices. The mechanical cleaving process separates the GaN-based chips from the source substrate housing the GaN-based chips. The source substrate may be discarded or be reused after transferring the GaN-based chips.

There are several disadvantages to this process. Because of mechanical forces involved, the cleaving process can result in damage to the donated devices and remnants of potential residual layer(s) above the donated devices. Removal of residual layer(s) may not always be possible, resulting in non-uniform substrate for subsequent processing. In some examples, a chemical mechanical polish (CMP) process may be utilized to remove such residual layer(s), subjecting the host carrier and the donated devices contained therein, to further mechanical stresses.

The inventors have found that by implementing a release layer as part of a material layer stack to form one or more devices on the source substrate, some of the issues mentioned above may be mitigated. The release layer can be advantageously removed by a non-mechanical process. In specific examples provided below such a release layer is part of a material layer stack utilized to form group III-N transistors, light emitting diodes (LEDs), or laser diodes. The type of material in the release layer may depend on the specific device and substrate type. In other examples, when the substrate includes III-V laser diodes, the release layer includes In, Ga, and As.

In accordance with an embodiment of the present disclosure a laser is utilized to bombard and penetrate a substrate and deposit energy into the release layer. Energy from the laser may cause the materials in the release layer to decompose and subsequently cause debonding between the release layer and layers immediately adjacent to it. However, to be of practical use the release layer must have a bandgap that is greater than a bandgap of the substrate to absorb the laser energy.

In one embodiment, the inventors have found that when a substrate includes group III-N transistors and micro-LED devices, the release layer may include an alloy of Nitrogen and a metal (metal-nitride). In an exemplary embodiment, the metal is a transition metal. In group III-N transistor embodiments, substrates include silicon having a (111) crystal plane, (herein silicon (111)), to advantageously utilize thermal and cost saving advantages of silicon. Silicon (111) based substrates may be advantageous in that a channel material that is defect free may be formed above the silicon (111) substrate. In an embodiment, when a channel material of a group III-N transistor includes GaN and the substrate includes silicon (111), one or more buffer layers may be utilized between the silicon (111) and the GaN channel. The buffer layers minimizes lattice mismatch between the silicon (111) substrate and the GaN channel Thus, the requirements of the release layer are twofold. Firstly, the release layer should not impede defect free crystal growth of the channel material and secondly, release layer should have a higher band gap relative to the substrate. The specific location of the metal nitride layer may be device specific. Factors such as crystal growth facilitation and mitigating lattice mismatch may dictate placement of the metal nitride layer within the material layer stack. In some embodiments, the metal nitride release layer is located above the buffer layer and below the group III-N channel layer. In some such embodiments, example, the metal nitride layer may be used as an intermediate nucleation layer for growth of III-N channel materials above the buffer layer. For example, since GaN may be epitaxially grown on Si(111), GaN can be grown epitaxially on a metal nitride release layer as well. In a second embodiment, the metal nitride release layer is between the buffer layer and the substrate.

After formation of the group III-N material layer stack, devices such as transistors and LEDs may be fabricated, and the source substrate may be bonded to a host substrate. By using one more lasers to deliver localized packets of energy to the metal nitride release layer, the metal nitride release layer may be vaporized, and group III-N devices may be selectively released. In embodiments where there is one or more buffer layers between the metal nitride release layer and the substrate, the one or more buffer layers and the substrate will be separated from the group III-N devices.

In some embodiments where portions of the metal nitride layer remains attached to the channel material, after device release, majority of the remaining portions of the metal nitride layer may be removed selectively by a wet chemical process. A wet chemical process is advantageous because it is free of mechanical forces, such as those induced during a CMP process.

For manufacturability, it is desirable to bond two substrates that have substantially the same size, such as substrates containing devices fabricated on 300 mm wafers. However, substrates that are mismatched in cross sectional contact area may be advantageously bonded when at least one of the substrates (the source substrate) includes a release layer. In some embodiments, all substrates include the release layer for process uniformity, where the release layer remains on the host substrate after the bonding and release process. Furthermore, because the process of laser ablation can be implemented at a local level, devices fabricated on distinct material substrates as well as those having diverse sizes can be bonded as long as one of the substrates includes the release layer. For example, devices made on InP substrates having a 150 mm wafer diameter can be bonded onto devices made on 300 mm silicon substrates.

FIG. 1 is a cross-sectional illustration of a stacked device structure 100 above a substrate 102. The stacked device structure 100 includes a first chiplet assembly 104 and a second chiplet assembly 106 on the chiplet assembly 104. The chiplet assembly 104 includes a chiplet 108. The chiplet 108 may include one or more devices such as transistors, diodes or memory devices coupled with transistors. The chiplet assembly 104 may be above a release layer 110. In an exemplary embodiment, the release layer 110 includes transition metal and nitrogen. In an embodiment, the metals include Ta, Ti, Nb, W and Mo. In some embodiments the transition metal and nitrogen form an alloy that is stoichiometric. In other embodiments, the transition metal and nitrogen form an alloy such as TaNx, TiN$_x$, NbNx, WNx, and MoNx, where 0<x<1. In other embodiments, the release layer 110 includes a ternary compound including two metals in the transition metal group and nitrogen. In exemplary examples the ternary compound includes transition metals Ta, Ti, Nb, W and Mo. In other examples, the release material includes In, Gas and As, as will be described further below. In an embodiment, the release layer 110 has a vertical thickness, $T_1$, between 10 nm and 25 nm. In some embodiments, $T_1$ is between 25 nm and 100 nm.

There may be one or more layers between the release layer 110 and the substrate 102. In the illustrative embodiment, the release layer 110 is on the substrate 102. The chiplet assembly 104 may also include a dielectric 112 as shown. The dielectric 112 provides a surface for plasma activation. As shown the dielectric 112 is directly on the chiplet 108. In some embodiments, the dielectric 112 includes a multilayer stack. An upper most portion of the dielectric 112 below uppermost surface 112A may have a nominal thickness between 1 nm to 300 nm for plasma activation. The chiplet assembly 104 may further include interconnect structures that provide routing for devices within chiplet 108. As shown, two interconnect structures 114A and 114B are shown in contact with chiplet 108. The number of interconnect structures may depend on the number of devices in the chiplet 108 and on configuration of routing lines connected to one or more devices within chiplet 108. The interconnect structures 114A and 114B may also be in contact with other IC elements that are on a same plane as the chiplet 108.

In an embodiment, the chiplet assembly 106 includes one or more features of the chiplet assembly 104. In the illustrative embodiment, chiplet assembly 106 is inverted with respect to chiplet assembly 104. Chiplet assembly 106 includes a chiplet 116. Chiplet 116 includes one or more devices such as transistors, diodes or memory devices coupled with transistors. The devices in chiplet 116 may include one or more devices that are substantially the same as one or more devices in chiplet 108. In other embodiments, chiplet 116 includes one or more devices that are substantially different from one or more devices in chiplet 108. As will be illustrated further below, devices in chiplet 116 are oriented in an opposite direction to devices in chiplet 108. It is to be appreciated, that the chiplet assembly 106 does not include a release layer, such as release layer 110 above the chiplet 116. In some embodiments, trace amounts of material that is substantially similar to a material of the release layer 110 may be present in an upper most portion of chiplet 116. As shown, an uppermost portion is defined between the dashed lines 117 and uppermost surface 116A of the chiplet 116. The upper most portion may extend vertically (along the Y-direction) to a thickness that ranges between 1-5 monolayers.

In the illustrative embodiment, the chiplet assembly 106 includes a dielectric 118. The dielectric 118 provides a surface 118A for plasma activation. As shown the dielectric 118 is directly below chiplet 116 and in contact with dielectric 112. The dielectric 118 may include a same material as a material of the dielectric 112. In other embodiments, where the dielectric 118 includes a multilayer stack, a lowermost portion of the dielectric 118 above a lowermost surface 118A may be substantially the same as the uppermost portion of the dielectric 112 below surface 112A, to facilitate a bonding process.

The chiplet assembly 106 further includes interconnect structures in contact with the chiplet 116. As shown, two interconnect structures 120A and 120B are in contact with chiplet 116 and in contact with interconnect structures 114A and 114B, respectively. In an embodiment, the interconnect structures 120A, 120B, 114A and 114B provide a way for chiplets 108 and 116 to be electrically coupled. The number of interconnect structures may depend on the number of devices in the chiplet 116 and on configuration of routing lines connected to one or more devices within the chiplet 116. The interconnect structures 120A and 120B may be in contact with other IC elements that are on a same plane as the chiplet 116.

FIGS. 2A-2D provide a method for combining chiplets from one substrate onto chiplets of another substrate to form the structure illustrated in FIG. 1.

Figure 2A:
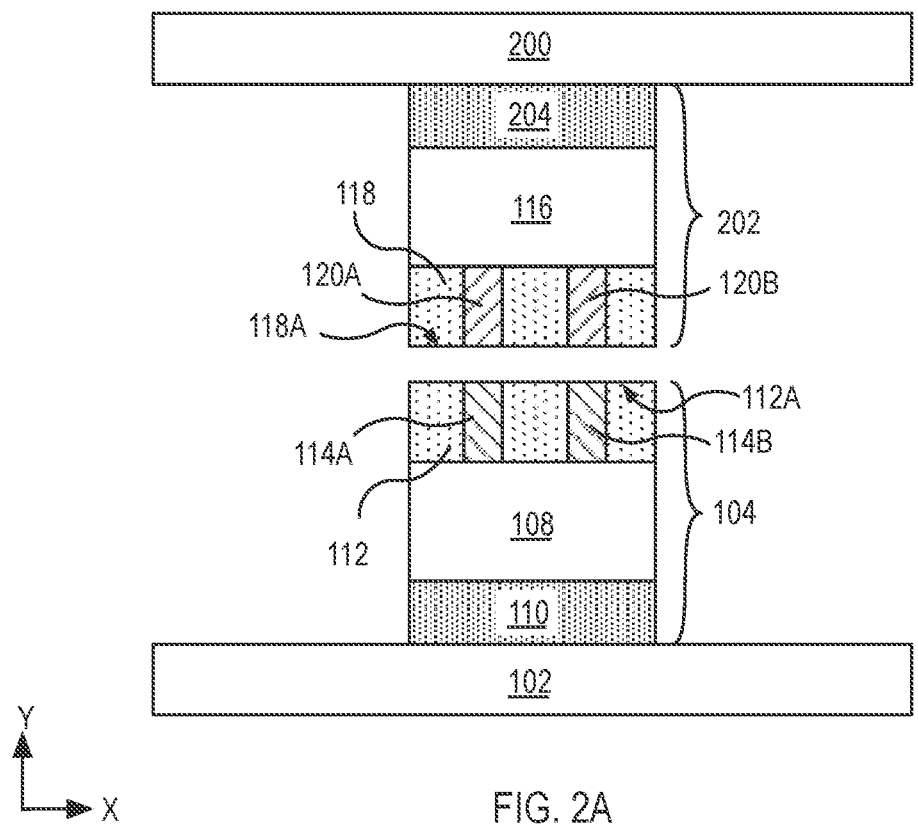
FIG. 2A is a cross-sectional illustration of a first substrate including a first chiplet on a release layer and a second substrate including a second chiplet, wherein the first substrate is above the second substrate and wherein the first substrate is inverted with respected to the second substrate.

FIG. 2A is a cross-sectional illustration of a substrate 200 including a chiplet assembly 202 that is inverted and aligned with a chiplet assembly, such as a chiplet assembly 104, in a toolset where bonding and release is to be performed.

In an embodiment, the chiplet assembly 202 includes one or more features of the chiplet assembly 106, such as devices, interconnects 120A and 120B and dielectric 118. As shown, the chiplet assembly 202 further includes a release layer 204, between the chiplet assembly 202 and the substrate 200. In an embodiment, the release layer 204 is substantially the same as the release layer 110 in the chiplet assembly 104.

The release layer 204 has a thickness, $T_3$, that is sufficient to enable crystal growth of a directly adjacent device layer of the one or more devices in the chiplet 202, and sufficiently thin enough to be removed by laser ablation. In various embodiments, the release layer 204 has a thickness between 10 nm and 25 nm.

In an embodiment, the chiplet assembly 202 is substantially identical to the chiplet assembly 104. In some such embodiments, the chiplet assembly 202 may be fabricated in a manner that is substantially the same as a process utilized to fabricate chiplet assembly 104. In other embodiments, the devices in chiplet 116 have substantially similar structures as devices in chiplet 108 but vary in dopant type and level and channel material. For example, chiplet 116 may include one or more N-polar group III-N transistors and the devices in chiplet 108 may include one or more Ga-polar group III-N transistors, or vice versa. In other embodiments, the devices in chiplet 116 include one or more N-polar or Ga-Polar group III-N transistors and the devices in chiplet 108 include one or more CMOS silicon transistors.

In embodiments where the devices in chiplets 108 or 116 include group III-N transistors, the substrate 102 or 200 include Si (111). In embodiments, where the devices in chiplets 108 includes CMOS transistor, the substrate includes Si(100).

Prior to bonding process substrates 102 and 200 undergo an surface activation to activate the dielectric 112 and 118 and interconnects 114A, 114B, 120A and 120B. The substrates 102 and 200 may undergo substantially similar or dissimilar implantation surface activation processes. In a hybrid bonding process that includes dielectric-dielectric and metal-metal bonding all surfaces are prepared simultaneously. In another embodiment, the dielectric surfaces 118A and 112A may be Ar or N2 plasma activated.

Figure 2B:
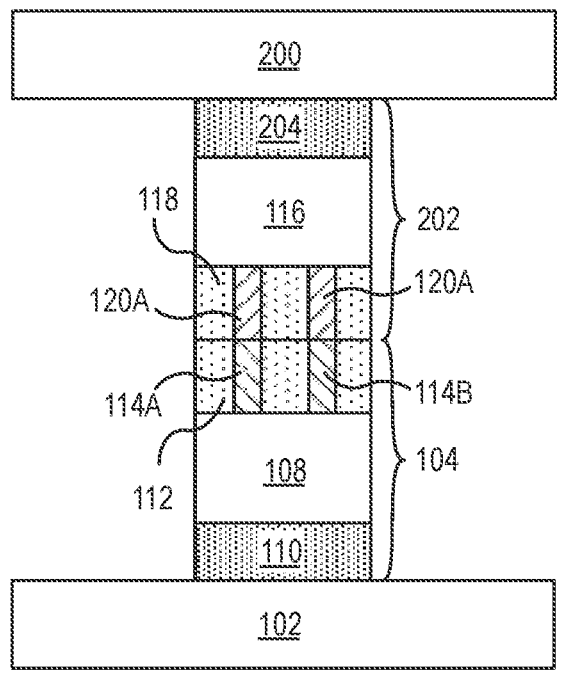
FIG. 2B is a cross-sectional illustration of the first chiplet in contact with the second chiplet following the process to bond the first chiplet with the second chiplet.

FIG. 2B is a cross-sectional illustration following the process to bring the first chiplet assembly 104 in contact with the chiplet assembly 202 and bond the first chiplet assembly 104 with the chiplet assembly 202. In an embodiment, a bonder apparatus enables precise bonding between chiplets 104 and 202 and is suitable for bonding one substrate pair at a time. In an embodiment, a bonding apparatus aligns the chiplets 104 in the lateral direction (X and Z direction in the illustration) and a thermal activation/anneal process is performed. Depending on a materials of each of the dielectric 112 and 118, bonding temperatures can range between 400 and 600 degrees Celsius.

In an embodiment, the dielectric 112 and 118 form a bond and material of the interconnects 114A and 114B undergo metallic bonding with the material of the interconnects 120A and 120B respectively. In an exemplary embodiment, where the interconnects 114A, 114B, 120A, 120B include copper, the interconnects 114A and 114B, and interconnects 120A and 120B undergo copper-copper fusion bonding.

Figure 2C:
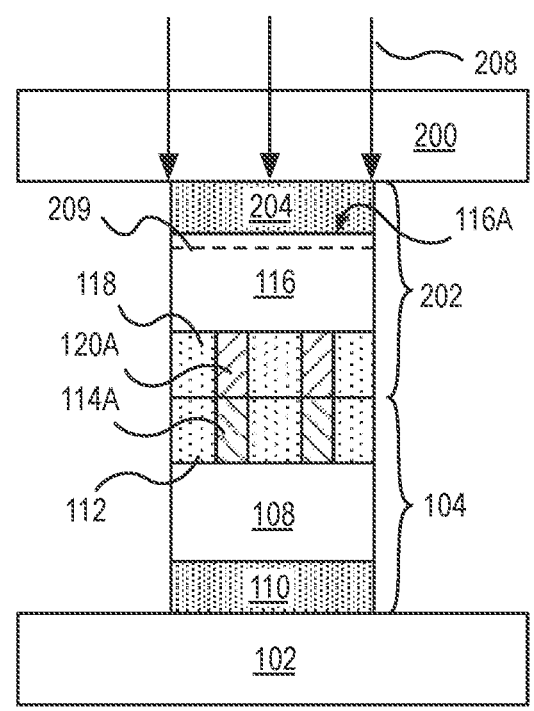
FIG. 2C is a cross-sectional illustration of a laser beam rastered onto a localized region of the first substrate above the first chiplet.

FIG. 2C is a cross-sectional illustration of a laser beam 208 rastered onto a region of the substrate 200 above the chiplet assembly 202. In an embodiment, an infrared laser is utilized. The wavelength of the infrared laser beam is sufficiently large to pass through substrate 200 and reaches the release layer 204. The infrared laser has a wavelength that is between 1500 and 3000 nm. The IR laser is rastered across a surface of the substrate 200 at a pulse rate of 0.1 picoseconds to 10 pico-seconds. In an exemplary embodiment, the IR laser beam has a wavelength of approximately 2000 nm and laser pulse of ~3 ps. The number of laser pulses may be between 1-100.

The release layer 204 has a thickness that enables the IR laser to ablate the materials in the release layer 204. A thickness between 10 nm and 25 nm is sufficiently thin for the IR laser to ablate the release layer 204 in as little as 1 picosecond to 10 picoseconds. To vaporize the release layer 204 the laser pulse has to sufficiently exceed the ablation threshold of the release layer 204. Example threshold values are 0.4 $J/cm^2$ (fluence) or 1 $J/cm^2$.

In an embodiment, the IR laser transfers sufficient energy into the release layer 204 to cause diffusion of one or more transition metals, In, Ga, or As in the release layer 204 towards an upper most portion below surface 116A of the chiplet 116. The diffusion of the one or more transition metals, In, Ga, or As is substantially limited to an uppermost portion of the chiplet 116 above dashed lines 209. The uppermost portion may range between 1-5 monolayers.

Figure 2D:
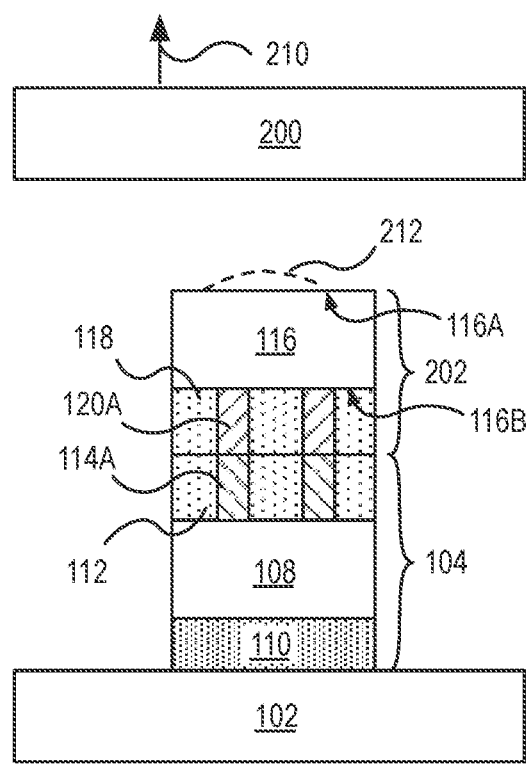
FIG. 2D is a cross-sectional illustration of the structure in FIG. 2C following a laser ablation of the release layer above the first chiplet.

FIG. 2D is a cross-sectional illustration of the structure in FIG. 2C following a laser removal of the release layer 204 from above the chiplet 202. In an embodiment, the substrate 200 is removed from above chiplet assembly 202 as illustrated by the direction of the arrow 210.

Once release layer 204 is removed, a wet chemical process may be utilized to remove any unablated remnants of the release layer 204 from the surface 116A. In some embodiments, a portion 212 of the release layer 204 remains affixed to the surface 116A. Such a portion 212 of the release layer 204 may be limited to a maximum thickness between 1 nm and 3 nm. The portion 212 may form a uniform thin layer or in other examples, the portion 212 is not well defined. In the illustrative embodiment, portion 212 is non-uniform and has a maximum thickness between 1 nm and 3 nm. In some embodiments, a wet chemical clean may reduce the remnant portion 212 to less than 1 nm.

It is to be appreciated that the devices in chiplet 116 are oriented in a direction opposite to the devices in the chiplet 108. For example, if devices include transistors with raised source/drain structures, then the source/drain structures in chiplet 116 will increase in thickness away from the surface 116A towards surface 116B, relative to a surface of a channel in the transistor. Examples of such transistors are described below.

Figure 3A:
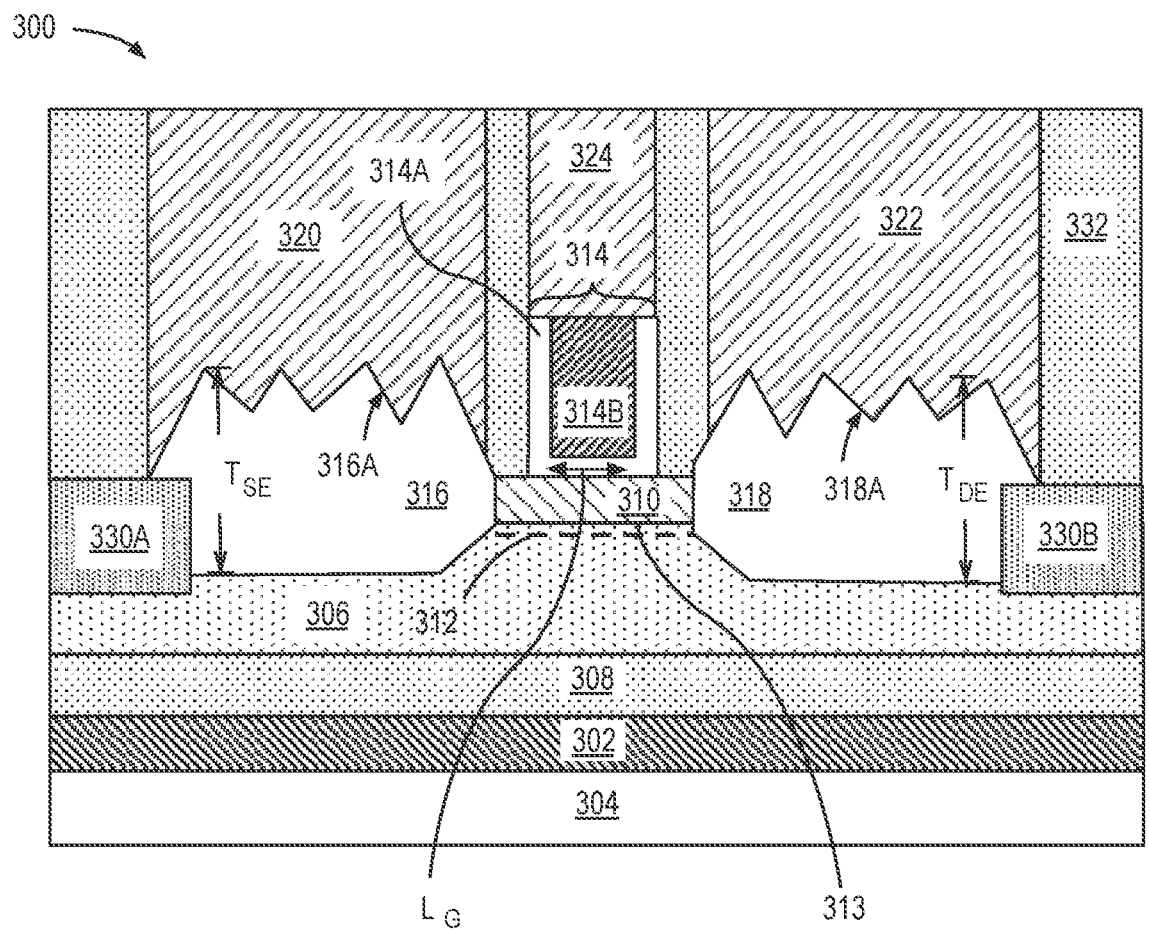
FIG. 3A is a cross-sectional illustration of a group III-N transistor including a metal-nitride layer, in accordance with an embodiment of the present disclosure.

FIG. 3A illustrates a cross-sectional illustration of a device 300, such as a III-N transistor structure 300, including a buffer layer 302 having a first III-N material on a substrate 304. A channel layer 306 including a second III-N semiconductor material is above the buffer layer 302. A release layer 308 including a nitrogen and a transition metal is between the buffer layer 302 and the channel layer 306. In an embodiment, the release layer 308 is substantially the same as the release layer 110 described above in association with FIG. 1.

The buffer layer 302 lattice minimizes a lattice mismatch between the channel layer 306 and the substrate 304. In embodiments where the channel layer 306 includes a Wurtzite GaN (3.189 A) and the substrate 304 includes Si(111), the lattice mismatch is at least 17%. The buffer layer 302 has a thickness that minimizes crystal defects in the 306 that would ordinarily arise from lattice mismatch between the 306 and the underlying substrate 304. The thickness of the buffer layer is also suitably chosen for its transparency to an infrared laser beam between 1500 and 3000 nm. In an embodiment, the buffer layer 302 has a thickness that is between 1 micron-3 microns. Depending on embodiments, the buffer layer 302 includes nitrogen and one or more of, Al, In or Ga, for example $Al_zGa_{1-z}N$, $Al_wIn_{1-w}N$, or AlN. In exemplary embodiments buffer layer 302 includes AlN. In an embodiment, an AlN buffer layer 302 has a hexagonal wurtzite structure. In some embodiments, the buffer layer 302 includes a plurality of layers of III-N materials above the substrate 304. The layers may be interleaved with two or more layers of III-N materials such as but not limited to $Al_zGa_{1-z}N$, $Al_wIn_{1-w}N$, or AlN.

In the illustrative embodiment, the placement of the release layer 308, between the buffer layer 302 and the channel layer 306 does not diminish the crystal structure of the channel layer 306. In an embodiment, release layer 308, including a transition metal and nitrogen has a hexagonal or a BCC crystal structure. Such a release layer 308 has a lattice constant between lattice constants of the channel layer 306 and the buffer layer 302. The material of the release layer 308 is suitably chosen to ablate with an infrared laser. As such the release layer 308 can function as a release layer and as well as a layer to preserve GaN epitaxy and III-N device performance.

In other embodiments, (not illustrated), the release layer 308 can be located between the buffer layer 302 and the substrate 304. In an embodiment, the buffer layer 302 has an epitaxial crystal structure above a substrate that includes Si (111).

As illustrated, the group III-N transistor further includes a polarization layer 310 on the channel layer 306 where the polarization layer 310 includes a suitable group III-N material. Both layers 306 and 310 may be collectively referred to herein as "device layers." The polarization layer 310 includes another III-N material that induces a 2-dimensional carrier gas, such as a 2D electron gas (2DEG), as indicated by the dashed lines 312. 2DEG 312 is within channel layer 306 near an interface 313 between the polarization layer 310 and the channel layer 306. The transistor structure 300 further includes a gate structure 314 above the polarization layer 310, a source structure 316 on one side of the gate structure 314, and a drain structure 318 on an opposite side of the source structure 316. The III-N transistor structure 300 further includes interconnect metallization structures, such as a source contact 320 or a drain contact 322 to enable electrical connectivity with circuit nodes. In the illustrative embodiment, a source contact 320 is coupled to the source structure 316, a drain contact 322 is coupled to the drain structure 318 and a gate contact 324 is coupled with the gate structure 314.

In an embodiment, the substrate 304, includes a semiconductor material. Examples of substrates include silicon (111) or silicon germanium (Ge). In an exemplary embodiment, the substrate 304 is a silicon substrate having a (100) top surface. A silicon substrate with a (100) top surface may facilitate co-integration of silicon CMOS transistor technology with a III-N material. In another embodiment, a silicon substrate has a (111) top surface.

In an embodiment, the channel layer 306 includes a III-N material such as gallium nitride (GaN). In an embodiment, channel layer 306 includes Wurtzite GaN having a lattice constant of 3.189 A. In some such embodiments, a lattice mismatch between Wurtzite GaN and a silicon substrate 304 with a (111) plane may be equal to or greater than 17%. In an embodiment, the GaN channel layer 306 is Ga-polar. In another embodiment, the GaN channel layer 306 is N-polar. A GaN channel layer 306 has a relatively high carrier mobility, (greater than 500 $cm^2 V^{-1}$). The GaN channel layer 306 may be a substantially un-doped III-Nitride material (e.g., $O_2$ impurity concentration minimized) for minimal impurity scattering. In other embodiments, the channel layer 306 includes one or more ternary alloys of GaN, such as AlGaN, AlInN, or a quaternary alloy of GaN including at least one group III element and nitrogen, such as $In_XAl_YGa_{1-X-Y}N$, where "X" ranges from 0.01-0.1 and "Y" ranges from 0.01-0.1. The channel layer 306 may have thickness between 100 nm and 5 microns. In an embodiment, the polarization layer 310 includes a suitable III-N material. In an embodiment, the polarization layer 310 includes a material such as, but not limited to, $Al_zGa_{1-z}N$, $Al_wIn_{1-w}N$, or AlN, where "Z" ranges from 0.2-0.3 and "W" ranges from 0.7-0.85. One combination includes a polarization layer 310 of AlGaN and a channel layer 306 of GaN. In an embodiment, the polarization layer 310 has a thickness sufficient to introduce a polarization difference in the interface 313 between the channel layer 306 and the polarization layer 310, creating a 2DEG in the vicinity of an uppermost surface of the channel layer 306. Depending on the choice of material, the polarization layer 310 has a thickness between 3 nm and 20 nm. In an exemplary embodiment, the polarization layer 310 is AlInN, a thickness between 3 nm and 10 nm. The presence of the 2DEG may support current conduction in the channel layer 306 between the source structure 316 and the drain structure 318 in the III-N transistor structure 300. In the illustrative embodiment, by biasing the gate structure 314 (e.g., negatively) relative to the source contact 320, such current conduction may be modulated (e.g., turned off).

In some embodiments, the source structure 316 and drain structure 318 each include a III-N material including indium, gallium and nitrogen. In some such embodiments, the indium level may be between 1-3 atomic percent of the material composition of the III-N material. In an embodiment where the source structure 316 includes indium, gallium and nitrogen, and the indium level is between 1-3 atomic percent of the material composition of the III-N material, the source structure 316 is substantially monocrystalline. As shown, the source structure 316 and drain structure 318 have upper most surfaces 316A and 318A that are multi-faceted. In some embodiments, the source structure 316 has a maximum thickness, $T_{SE}$ that is between 60 nm and 100 nm. The thickness, $T_{SE}$, may vary across a width (along X-direction) of the source structure 316 due to III-N material microstructure (e.g., polycrystallinity) of the source structure 316, as shown. In some embodiments, the drain structure 318 has maximum thickness, $T_{DE}$, that is between 60 nm and 100 nm. The thickness, $T_{SE}$, may vary across a width (along X-direction) of the drain structure 318 due to the polycrystallinity of the III-N material of the drain structure 318, as shown.

In an embodiment, the gate structure 314 includes a combination of gate electrode layers. In other embodiments, the gate structure 314 includes a gate dielectric layer 314A and a gate electrode 314B. In the illustrative embodiment, the gate structure 314 includes a gate electrode 314B and a gate dielectric layer 314A between the polarization layer 310 and the gate electrode 314B, and adjacent to sidewalls of the gate electrode 314B. The gate dielectric layer 314A may have a high relative permittivity (i.e., dielectric constant, or K, exceeding that of silicon nitride). In some high-K gate dielectric embodiments, the gate dielectric layer 314A is a metal oxide (e.g., including oxygen and one or more metals, such as, but not limited to, aluminum, hafnium, zirconium, tantalum or titanium). In another embodiment, the gate dielectric layer 314A includes silicon and at least one of oxygen (e.g., silicon dioxide) or nitrogen (e.g., silicon nitride). In some examples, the gate dielectric layer 314A has a thickness between 2 nm and 10 nm.

In an embodiment, the gate electrode 314B includes a metal such as, but not limited to, Pt, Ni and an alloy such as TiN or TaN. In one such embodiment, the gate electrode 314B has a gate length, $L_G$, approximately between 10 nm and 100 nm. In some embodiments, the gate electrode 314B further includes a work function metal and a gate cap. The work function metal may include a metal such as Pt, Ni, and an alloy such as TiN or TaN and the gate cap may include a metal, such as W, for example.

In the illustrative embodiment, the III-N transistor structure 300 further includes at least one isolation structure for electrical isolation from an adjacent III-N transistor. In the illustrative embodiment, the III-N transistor structure 300 includes isolation structures 330A and 330B adjacent to the source structure 316 and drain structure 318, respectively. The isolation structures 330A and 330B provides electrical isolation between adjacent III-N transistors. The isolation structures 330A and 330B may also provide a buffer region for lateral overgrowth of the source structure 316 and drain structure 318, as illustrated. Isolation structures 330A and 330B include any material that has sufficient dielectric strength to provide electrical isolation such as, but not limited to, silicon dioxide, silicon nitride, silicon oxynitride, carbon doped nitride and carbon doped oxide.

In the illustrative embodiment, the source contact 320, the drain contact 322 and the gate 314 are adjacent to a dielectric 332. Examples of the dielectric 332 may include any material that that has sufficient dielectric strength to provide electrical isolation such as, but not limited to, silicon dioxide, silicon nitride, silicon oxynitride, carbon doped nitride and carbon doped oxide. In an embodiment, the dielectric 332 includes a material that is the same or substantially the same as the material of the isolation structures 330A and 330B.

In an embodiment, the source contact 320, the drain contact 322 and gate contact include a liner layer and a fill metal adjacent to the liner layer. The liner material may include, for example, a metal such as ruthenium, titanium or tantalum or an alloy such as TiN or TaN. A fill metal may include tungsten, nickel, aluminum, copper, or cobalt.

Figure 3B:
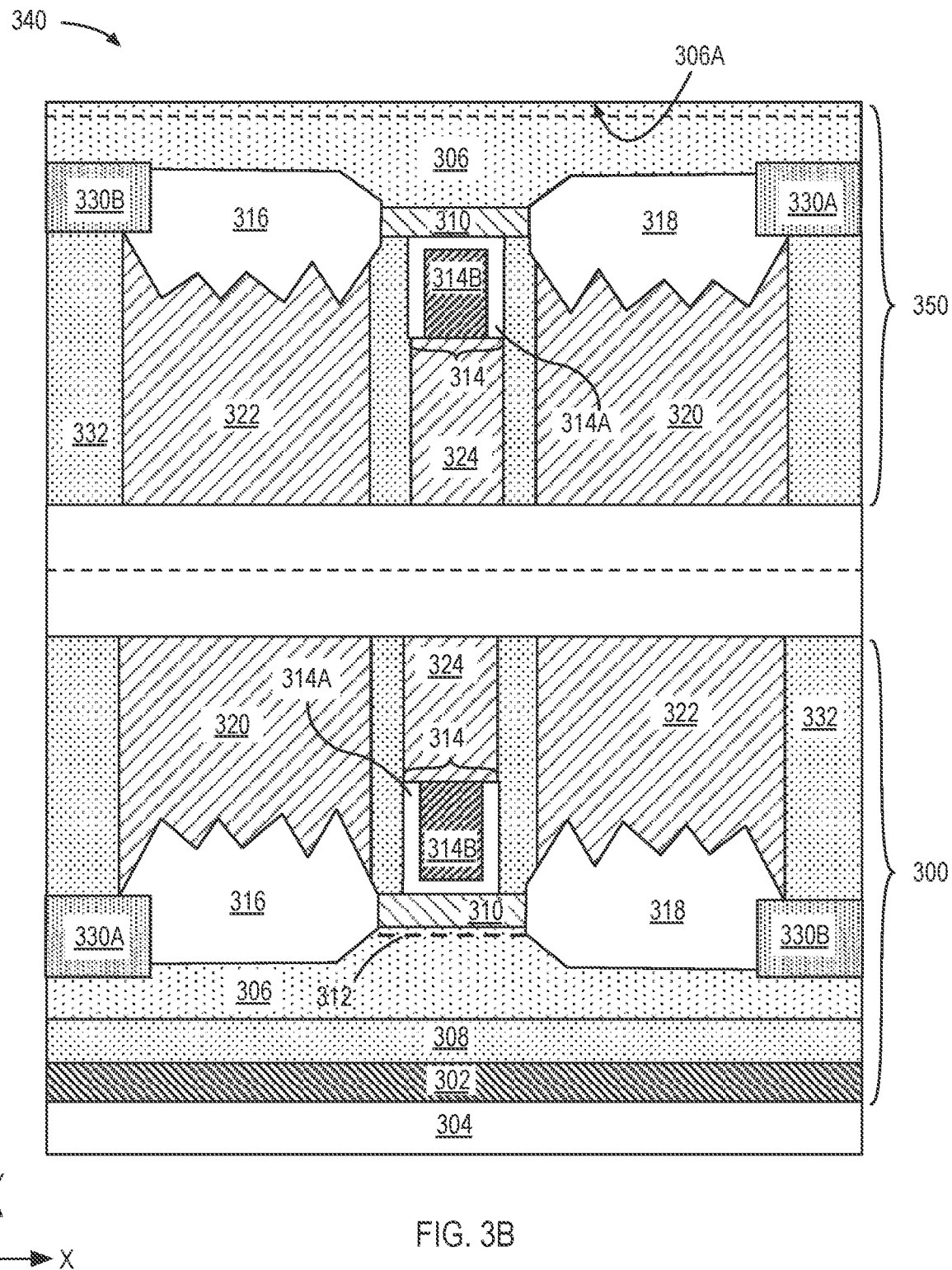
FIG. 3B is a cross-sectional illustration of a first group III-N transistor including a metal nitride layer and an inverted second group III-N transistor above the first group III-N transistor.

FIG. 3B is a cross-sectional illustration of a stacked transistor structure 340 including a first group III-N transistor 300 including a release layer 308 an inverted second group III-N transistor 350 above the first group III-N transistor 300. A dielectric 360 is between the group III-N transistor 300 and group III-N transistor 350. The dielectric 360 may include a single material or include two substantially similar materials. The dielectric 360 may include one or more routing interconnects (not shown) to couple group III-N transistor 300 and group III-N transistor 350. In an embodiment, the dielectric 360 is substantially the same as the dielectric 332.

The group III-N transistor 350 may include substantially the same materials and features of the group III-N transistor 300. In other embodiments, the group III-N transistor 350 may include substantially the same materials and features of the group III-N transistor 300 except for the material and dopant of channel layer 306. In the illustrative embodiment, the group III-N transistor 350 has one or more features of the group III-N transistor 300 such as the channel layer 306, polarization layer 310, gate structure 314, source structure 316, drain structure 318, source contact 320, drain contact 322 and dielectric 332. As shown the release layer 308 is present in the group III-N transistor 300 but is not present in the group III-N transistor 350. While a release layer 308 is not present in group III-N transistor 300, an upper portion of the channel layer 306, above dashed line 352 and below surface 306A, may include trace amounts of one more transition metals, such as Ta, Ti, Nb, W or Mo.

It is to be appreciated that the group III-N transistor 300 may have a substantially same lateral dimension (along the X-axis) as the group III-N transistor 350. A substantially same lateral dimension may enable a large collection of stacked transistor structures, such as transistor structure 340 that are laterally and uniformly spaced apart from each other.

Figure 3C:
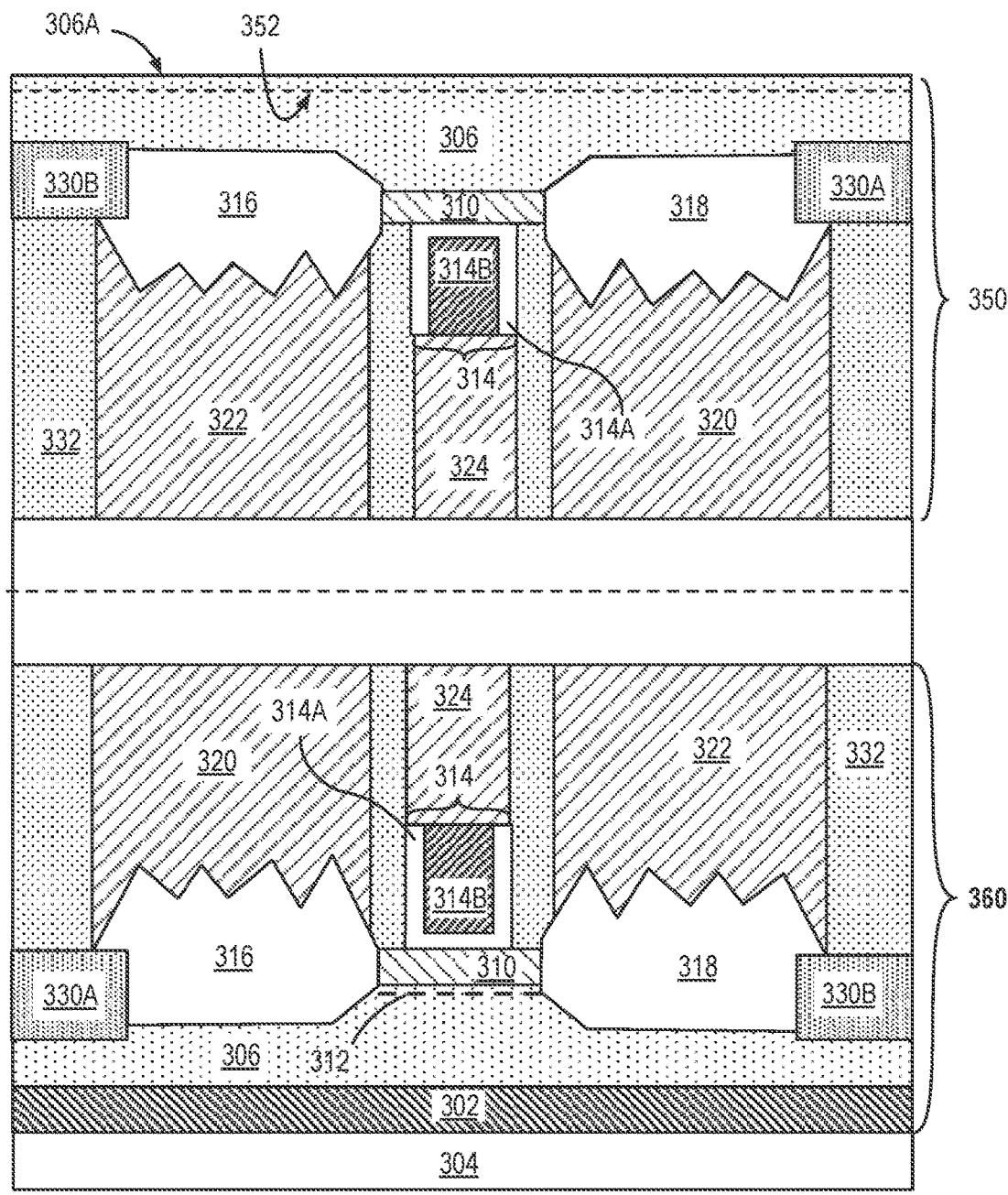
FIG. 3C is a cross-sectional illustration of a first group III-N transistor and an inverted second group III-N transistor above the first group III-N transistor, in accordance with an embodiment of the present disclosure.

While the group III-N transistor 300 includes release layer 308, in other embodiments, the group III-N transistor 360 does not include the release layer 308 such as is illustrated in FIG. 3C. In some such embodiments, substrate 304 is a source substrate, where the source substrate is directly adjacent to the buffer layer 302. In an embodiment, other than the absence of the release layer 308 the group III-N transistor 360 may be identical to group III-N transistor 300.

While the stacked transistor structure 340 is depicted to include group III-N transistors, in other embodiments, group III-N transistor structures are stacked above conventional CMOS transistor. Cross-sectional illustrations depicting fabrication of hybrid transistor structures, such as group III-N transistors above CMOS transistors, are presented in FIGS. 4A-4C.

FIG. 4A is a cross-sectional illustration an array of group III-N transistors including group III-N transistor 300 and a group III-N transistor 400 above a common substrate 304. As shown, the group III-N transistor 300 and a group III-N transistor 400 are in direct contact with release layer 308 that is on buffer layer 302, formed above the substrate 304.

In an embodiment, the group III-N transistor 400 includes one or more features of the group III-N transistor 400. Group III-N transistor 300 and group III-N transistor 400 may have some differing features, such as gate length, gate electrode materials etc. However, the channel layer 306 and polarization layer 310 is identical in each transistor as Group III-N transistors 300 and 400 may be fabricated after formation of a shared buffer layer 302, release layer 308, channel layer 306 and polarization layer 310 above the substrate 304.

In the illustrative embodiment, the group III-N transistor 400 is separated and electrically isolated from a substantially identical transistor Group III-N transistor 300, by a dielectric 402. Dielectric portions 404A and 404B may be formed above the Group III-N transistors 300 and 400. The dielectric portions 404A and 404B may include interconnect circuitry to couple Group III-N transistors 300 and 400, respectively, with other IC components on a future host substrate.

As shown, an interconnect structure 406A is above dielectric portion 404A and an interconnect structure 406B is above dielectric portion 404B. In an embodiment, the interconnect structures 406A and 406B includes routing layers within one or more layers of dielectric. In an embodiment, the routing layers in the interconnect structures 406A and 406B include copper, tungsten, nickel or cobalt. The routing layers in the interconnect structures 406A and 406B may form metal-metal bonding with similar interconnect structures present in a host substrate. In an embodiment, an uppermost dielectric in the interconnect structures 406A and 406B may for dielectric-dielectric bonding with similar dielectric present in a host substrate.

FIG. 4B is a cross-sectional illustration of the structure in FIG. 4A, following the process of inverting substrate 304 and bonding group III-N transistors 300 and 400 to devices 408 and 410 on a host substrate 412. In an embodiment, the devices 408 and 410 are MOS transistors 408 and 410. The MOS transistors 408 and 410, maybe both n-MOS or p-MOS transistors. As shown, interconnect structure 414 is above device 408 and an interconnect structure 416 is above device 408. The interconnect structures 414 and 416 may include one or more levels of interconnects formed in one or more corresponding levels of dielectric. In an embodiment, the interconnects within the interconnect structures 414 and 416 include copper, tungsten, nickel or cobalt.

The process of inverting the substrate 304 and bonding group III-N transistor 300 with MOS transistor 408 and bonding group III-N transistor 400 with MOS transistor 410 is substantially the same as is described above. In the illustrative embodiment, the interconnect structures 406A and 406B are in contact with interconnect structures 414 and 416, respectively via a hybrid bonding process. As shown, dielectric 402 is in contact with dielectric 418 after the bonding process.

Figure 4C:
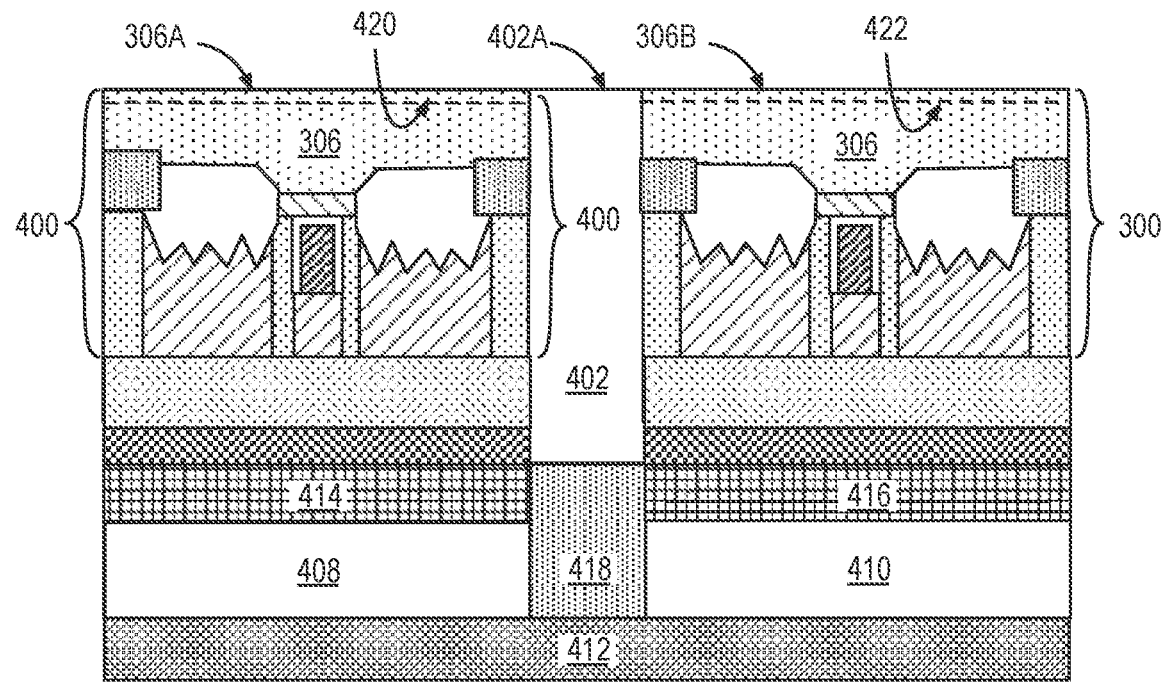
FIG. 4C is a cross-sectional illustration of the structure in FIG. 4B following the process to laser ablate a release layer above the inverted first and second group III-N transistors and release the first and second group III-N transistors, in accordance with an embodiment of the present disclosure.

FIG. 4C is a cross-sectional illustration of the structure in FIG. 4B following the process to ablate release layer 308. After the process of bonding, a process to ablate release layer 308 is performed by utilizing a process as described above. In an embodiment, an infrared laser with a wavelength between 1600 nm and 3000 nm is rastered over the surface of the substrate 304. In an embodiment, the entire release layer 308 is removed.

The process of laser ablation releases fully isolates transistor 300 from transistor 400. In the illustrative embodiment, the transistors 300 and 400 do not include the release layer 308 and the buffer layer 302 that was shared between transistors 300 and 400 prior to release. While the release layer 308 is removed, an upper portion of the channel layer 306 (above dashed lines 420 and 422), and below surfaces 306A and 306B, respectively, may include trace amount of one more transition metals, such as Ta, Ti, Nb, W or Mo. In an embodiment, the trace amount of one more transition metals may be substantially similar in the channel layer 306 in each group III-N transistor 300 and 400. In some embodiments, an upper portion of the dielectric 402 below dielectric surface 402A includes trace amount of one more transition metals, such as Ta, Ti, Nb, W or Mo.

In the illustrative embodiment, the buffer layer 302 and the substrate 304 have been from above the substrate 412. The stacked structure in FIG. 4C is subsequently ready for further downstream processing.

While the process described in association with FIGS. 4A-4C illustrate bonding between group III-N transistors having a same channel layer material, the process can be adapted to bond group III-N transistors having different materials in a channel layer. In some such embodiments, a process of bonding and laser ablation is carried out to stack a first group III-N transistor such as transistor 300 to a first interconnect structure, for example interconnect structure 416. The process of bonding and laser ablation may be repeated to bond and release a second group III-N transistor on to a second interconnect structure, for example interconnect structure 414. Such a process can form group III-N transistors having different channel layers, which is ordinarily not practically feasible in such proximity. It is to be appreciated that group III-N transistors 300 and 400 are inverted relative to transistors 408 and 410.

In other examples, the process of bonding and laser ablation, described above can be implemented in applications other than transistors, such as fabrication of light emitting diodes and laser diode, where an alloy layer can be integrated as a part of a device stack and removed without adverse impact on a device.

To this end, the process of laser ablation of an alloy layer including a transition metal and nitrogen can be implemented in development of light emitting diode (LED) displays. LEDs form the backbone of display technologies. LEDs such as, organic LED (OLED) form the basis for many high-definition displays that are commercially available. OLEDs are advantageous over conventional LEDs in that each pixel in an OLED display can emit light of a certain color independently and be switched on and off individually. However, OLED's suffer a drawback in the maximum brightness attained and in areas of luminance decay, which is the decay rate in the luminosity of the OLED. Furthermore, power consumption of OLEDs can limit display time in portable display technologies, such as is used in handheld devices.

Micro LEDs offer a distinct advantage in areas of power consumption over OLEDs. Micro LEDs may consume less than half the power of OLEDs. Furthermore, because of the inorganic nature of emitting materials in micro-LEDs, their efficiency and narrow emission bands, μLED offers the prospect of significantly improved performance. Improvements include reduction in energy consumption, increased color gamut, brightness, contrast (High Dynamic Range), long lifetime and environmental stability (not sensitive to air, moisture), and compatibility with flexible backplane technologies to enable curved or flexible displays.

In a typical display, each pixel constitutes Red, Green and Blue (RGB) subpixels, which are controlled independently by a matrix of transistors. μLED displays use individual, small LED chips as sub-pixels. Unlike OLEDs, inorganic LED require high processing temperatures (>1000° C.) and can't be "grown" and patterned directly on top of the transistor matrix. In most examples, μLED chips are, therefore, manufactured separately, positioned and connected to the transistor matrix via a pick and place process.

While micro LED devices can be manufactured on silicon substrates, releasing millions of LEDs from silicon substrates on to host carriers remains challenging due to release mechanisms. Such challenges may be mitigated by implementing an alloy layer comprising a transition metal and nitrogen in a material layer stack for a micro-LED and transferring the micro-LED onto a transistor matrix by a selective laser ablation-based release process.

In accordance with an embodiment of the present disclosure, a micro-light emitting diode (LED) device includes an alloy layer including nitrogen and a transition metal, a layer including a first III-N material on the alloy layer. In an embodiment, the micro-LED device further includes a compound semiconductor structure including a second III-N material on the first III-N material, In an embodiment, the first III-N material is a seed layer for the second III-N material. In some embodiments, the compound semiconductor structure has a first portion on the first III-N material and a second portion that is connected with the first portion, where the second portion has a pyramidal shape and faceted sidewalls. The micro-LED device further includes a layer including a third III-N material on the faceted sidewalls of the second portion of the compound semiconductor structure. The third III-N material forms a PN junction with the second portion of the compound semiconductor structure.

In another embodiment, the second portion of the compound semiconductor structure is in contact with the alloy layer through an opening in the first III-N material.

Figure 5A:
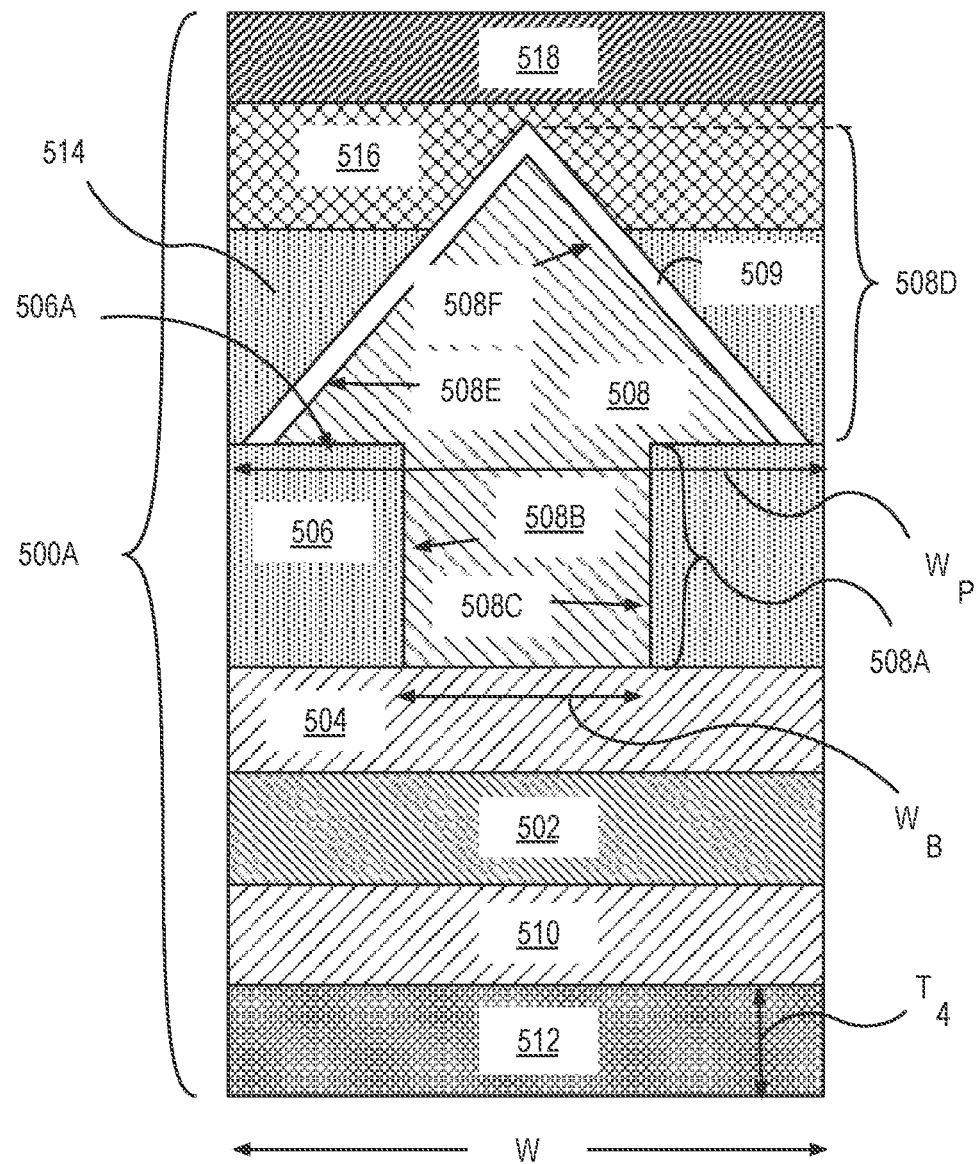
FIG. 5A is a cross-sectional illustration of a light emitting diode device above a metal nitride layer, in accordance with an embodiment of the present disclosure.

FIG. 5A is a cross-sectional illustration of a micro-LED device structure 500A, in accordance with an embodiment of the present disclosure. The micro-LED device 500 structure includes a release layer 502 comprising nitrogen and a transition metal, a seed layer 504 including a first III-N material on the release layer 502 and a dielectric 506 on a portion of the layer comprising the first III-N material. In an embodiment, the release layer 502 includes transition metal and nitrogen. In an embodiment, the metals include Ta, Ti, Nb, W, Hf or Mo. In some embodiments the transition metal and nitrogen form an alloy that is stoichiometric. In other embodiments, the transition metal and nitrogen form an alloy such as $TaN_x$, $TiN_x$, $NbN_x$, $WN_x$, $MoN_x$ or $HfN_x$ where 0<x<1. In other embodiments, the release layer 502 includes a ternary compound including two metals in the transition metal group and nitrogen. In exemplary examples the ternary compound includes transition metals Ta, Ti, Nb, W, Hf or Mo. In an embodiment, release layer 308, including a transition metal and nitrogen has a hexagonal or a BCC crystal structure. In an embodiment, release layer 502 has a hexagonal or a BCC crystal structure. Such a release layer 502 has a lattice constant that is comparable to a lattice constant of the seed layer 504. In an embodiment, the release layer 502 has a thickness, $T_4$, between 10 nm and 50 nm.

The micro-LED device 500 structure includes a compound semiconductor structure 508 having a second III-N material adjacent to the seed layer 504. As shown, the compound semiconductor structure 508 is on the seed layer 504. In an embodiment the compound semiconductor structure 508 includes a first portion 508A (herein, semiconductor structure portion 508A) having a first sidewall 508B and a second sidewall 508C opposite to the first sidewall 508B, where the sidewall 508B and sidewall 508C are each adjacent to the dielectric 506. The compound semiconductor structure 508 further includes a second semiconductor structure portion 508D, connected to the semiconductor structure portion 508A, where the semiconductor structure portion 508D is partly on a surface 506A of the dielectric 506. In an embodiment, the semiconductor structure portion 508D has a pyramidal structure having faceted sidewalls. In the illustrative embodiment, semiconductor structure portion 508D has faceted sidewalls 508E and 508F that meet at an apex. Faceted sidewalls 508E and 508F are indicative of a fabrication process utilized to form the micro-LED device structure 500A. Faceted sidewalls are suitable for fabricating monolithic red-green-blue micro LEDs on a single substrate.

The semiconductor structure portion 508D has a lateral dimension, $W_P$ and the semiconductor structure portion 508A has a lateral dimension, $W_B$, as shown. In the illustrative embodiment, $W_P$ is greater than $W_B$.

The semiconductor structure 508 may be chosen for a specific LED color. In an embodiment, the semiconductor structure 508 includes a III-N material such as an N-doped gallium nitride (GaN). In an embodiment, semiconductor structure 508 includes N-doped Wurtzite GaN having a lattice constant of 3.189 A. In some such embodiments, a lattice mismatch between N-doped Wurtzite GaN and a substrate 512 including silicon (111) upper surface may be equal to or greater than 17%.

In some embodiments, for a red LED, the semiconductor structure portion 508 has a multi-layer quantum well (MQW) including a layer of InGaN on a layer of GaN, where Indium is at least 42%. In some embodiments, for a Green LED, the semiconductor structure portion 508 has a multi-layer quantum well (MQW) including a layer of InGaN on a layer of GaN, where Indium is at least 30% but less than 42%. In some embodiments, for a Blue LED, the semiconductor structure portion 508 has a multi-layer quantum well (MQW) including a layer of InGaN on a layer of GaN, where Indium is at least 20% but less than 30%.

As shown, a doped layer 509 is directly adjacent to the faceted sidewalls 508E and 508F. Doped layer 509 includes a P-type dopant. The P-doped layer 509 forms a PN junction at an interface between the P-doped layer 509 and the N-doped semiconductor structure portion 508D.

In the illustrative embodiment, the micro-LED device structure 500A further includes a buffer layer 510 directly below and adjacent the release layer 502. As shown the buffer layer 510 is between the release layer 502 and a substrate 512. In an embodiment, the buffer layer 510 includes a material that is the same or substantially the same as the material of the buffer layer 302. In another embodiment, the buffer layer 510 includes a material that is substantially the same as the material of the seed layer 504. In an exemplary embodiment, seed layer 504 and buffer layer 510 both include AlN.

A second dielectric 514 is adjacent to the P-doped layer 509, as shown. In an embodiment, the dielectric 506 and 514 may include a same material that provides electrical isolation and a hermitic seal. Examples of the dielectric 506 and 514 may include any material that has a sufficient dielectric strength to provide electrical isolation such as, but not to, limited silicon dioxide, silicon nitride, silicon oxynitride, carbon doped nitride or carbon doped oxide.

In the illustrative embodiment, the micro-LED device structure 500A further includes an alloy layer 516 adjacent to an upper most portion of P-doped layer 509. In an embodiment, the alloy layer 516 includes Al and Si. The content of Si in the Al—Si alloy can be used to control the electrical properties such as conductivity of the film.

The micro-LED device structure 500A further includes an electrode layer 518 above the alloy layer 516. As shown, the electrode layer 518 is on the alloy layer 516. In an embodiment, the electrode layer 518 includes one or more of aluminum, copper, tungsten, tantalum or ruthenium.

Figure 5B:
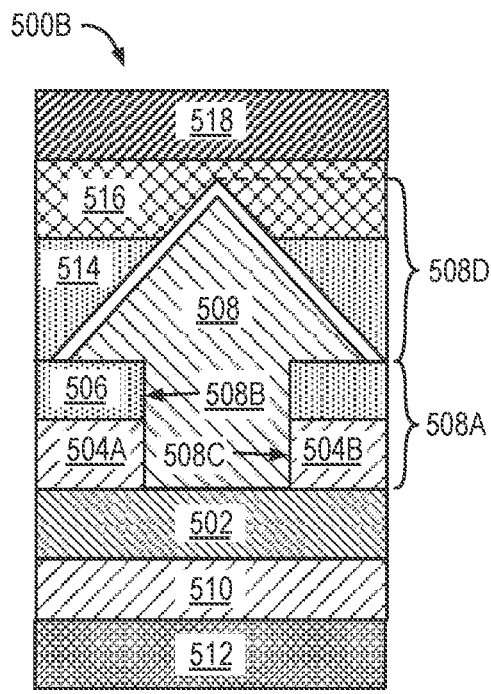
FIG. 5B is a cross-sectional illustration of a light emitting diode device above a metal nitride layer, in accordance with an embodiment of the present disclosure.

FIG. 5B is a cross-sectional illustration of a micro-LED device 500B on the release layer 502, in accordance with an embodiment of the present disclosure. As shown, the semiconductor structure portion 508A is on the release layer 502. In the illustrative embodiment, the placement of the release layer 502 between the buffer layer 510 and the semiconductor structure portion 508A does not diminish the crystal structure of the compound semiconductor structure 508. In an embodiment, release layer 502, has a hexagonal or a BCC crystal structure. Such a release layer 502 has a lattice constant between a lattice constant of compound semiconductor structure 508 and a lattice constant of the buffer layer 510.

In an embodiment, the seed layer 504 includes a first seed layer portion 504A and a second seed layer portion 504B on the release layer 502 (as shown in the cross-sectional illustration). In the illustrative embodiment, a lower section of the semiconductor structure portion 508A is directly adjacent to the seed layer portions 504A and 504B. As shown, sidewall 508B is directly adjacent to portion 504A and sidewall 508C is directly adjacent to portion 504B.

The micro-LED device 500B has one or more features of the micro-LED device 500A such as the pyramidal semiconductor structure portion 508D, buffer layer 510, the alloy layer 516, and the electrode layer 518.

Figure 5C:
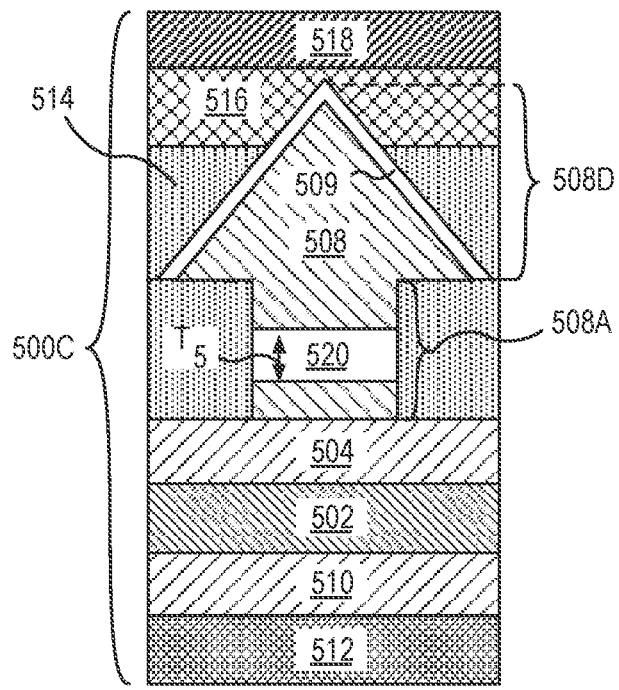
FIG. 5C is a cross-sectional illustration of a light emitting diode device above a metal nitride layer, in accordance with an embodiment of the present disclosure.

FIG. 5C is a cross-sectional illustration of a micro-LED device 500C, where the compound semiconductor structure 508 includes a multilayer stack. The multilayer stack enhances electron injection efficiency, and internal quantum efficiency of the micro-LED device 500C. As shown, the semiconductor structure portion 508A includes a first N-Polar group III-N material portion 508AA above the seed layer 504, a polarity inversion layer 520 on the first N-Polar group III-N material portion 508AA and a second N-Polar group III-N material portion 508AB on the polarity inversion layer 520.

In an embodiment, the group III-N material portions 508AA and 508AB include a same material as the material of the compound semiconductor structure 508 described above. In an embodiment, the polarity inversion layer 520 includes Mg3N2 or Al2O3. The polarity inversion layer 520 may have a thickness, $T_5$, between 5 nm and 10 nm.

FIG. 6A is a cross-sectional illustration following the formation of a multilayer stack 600 for fabrication of a micro-LED device, in accordance with an embodiment of the present disclosure. As shown, a buffer layer 510 is formed on substrate 512.

In an embodiment, the buffer layer 510 is formed to overcome lattice and thermal mismatch between the substrate 512 and group III-N semiconductor material to be formed above. In other embodiments, the buffer layer 510 is formed to facilitate a laser ablation process to be utilized in a subsequent operation. The buffer layer 510 may be grown on the substrate 512 by a metal organic chemical vapor deposition (MOCVD) process at a temperature in the range of 1000-1100 degrees Celsius. In an exemplary embodiment, the buffer layer 510 includes AlN. The buffer layer 510 including AlN may be grown to a thickness between 25 nm and 100 nm.

The release layer 502 is formed on the buffer layer 510. In an embodiment, the release layer 502 is deposited by a PVD or and ALD process. The release layer 502 is formed to a thickness between 10 nm and 25 nm. In an embodiment, the release layer 502 has a hexagonal, BCC or a Wurtzite crystal structure.

The seed layer 504 is formed on the release layer 502. In an embodiment, the seed layer 504 includes a same material as the material of the buffer layer 510. In an embodiment, the seed layer 504 is fabricated by an MOVCD epitaxy process. The seed layer is deposited to a thickness between 25 nm and 50 nm.

FIG. 6B is a cross-sectional illustration of the structure in FIG. 6A following the process of patterning the material layer stack 600 to form a micro LED device base 602. The patterning process may utilize formation of a photoresist mask on the material layer stack 600 and patterning of the material layer stack 600 by a plasma etch process. In an embodiment, once the micro LED device base 602 is formed, a dielectric 506 is deposited on the seed layer 504 and patterned. The patterning process forms an opening 604 in the dielectric 506.

FIG. 6C is a cross-sectional illustration of the structure in FIG. 6B following the formation of a compound semiconductor structure 508 in the opening 604. In an embodiment, a MOCVD epitaxy process is utilized. In an embodiment, MOCVD process forms a group III-N semiconductor material having a Wurtzite crystal structure. The group III-N semiconductor material forms a semiconductor structure portion 508A in the opening 604 adjacent to the dielectric 506. The MOCVD process may be continued until a semiconductor structure portion 508D is formed above the semiconductor structure portion 508A. The latter growth process is unrestricted by the dielectric 506 and the semiconductor structure portion 508D grows to form faceted sidewalls 508E and 508F. In the illustrative embodiment, the faceted sidewalls 508E and 508F meet at an apex. The MOCVD process is further utilized to form a P-doped layer 509 on the faceted sidewalls 508E and 508F of the semiconductor structure portion 508D.

FIG. 6D is a cross-sectional illustration of the structure in FIG. 6C following the formation of a dielectric 514 on the P-doped layer 509. In an embodiment, the dielectric is deposited by a PECVD process. and then planarized. After the planarization process the dielectric 514 may be recessed by a wet chemical process to a level below an upper apex of the semiconductor structure portion 508D. Portions of the P-Doped layer 509 are exposed after the wet chemical process.

FIG. 6E is a cross-sectional illustration of the structure in FIG. 6D following the formation of an alloy layer 516 on an uppermost surface of the dielectric 514. In an embodiment, the alloy layer 516 is deposited to a thickness, $T_6$, between 20 nm and 50 nm. An electrode layer 518 is subsequently deposited on the alloy layer 516. In an embodiment, a resist mask is formed on the electrode layer 518 and the material layer stack 600, the dielectric 506 and 514, the alloy layer 516 and the electrode 518 is patterned to form a single micro-LED structure 500A.

While one micro-LED structure is illustrated in FIG. 6A-6E, a substrate includes a large array of micro-LED structures, such as micro-LED structures 500A, 500B or 500C. Once a large collection of micro-LED structures are fabricated on a single substrate. The substrate may be prepared for bonding to a host substrate.

Figure 7A:
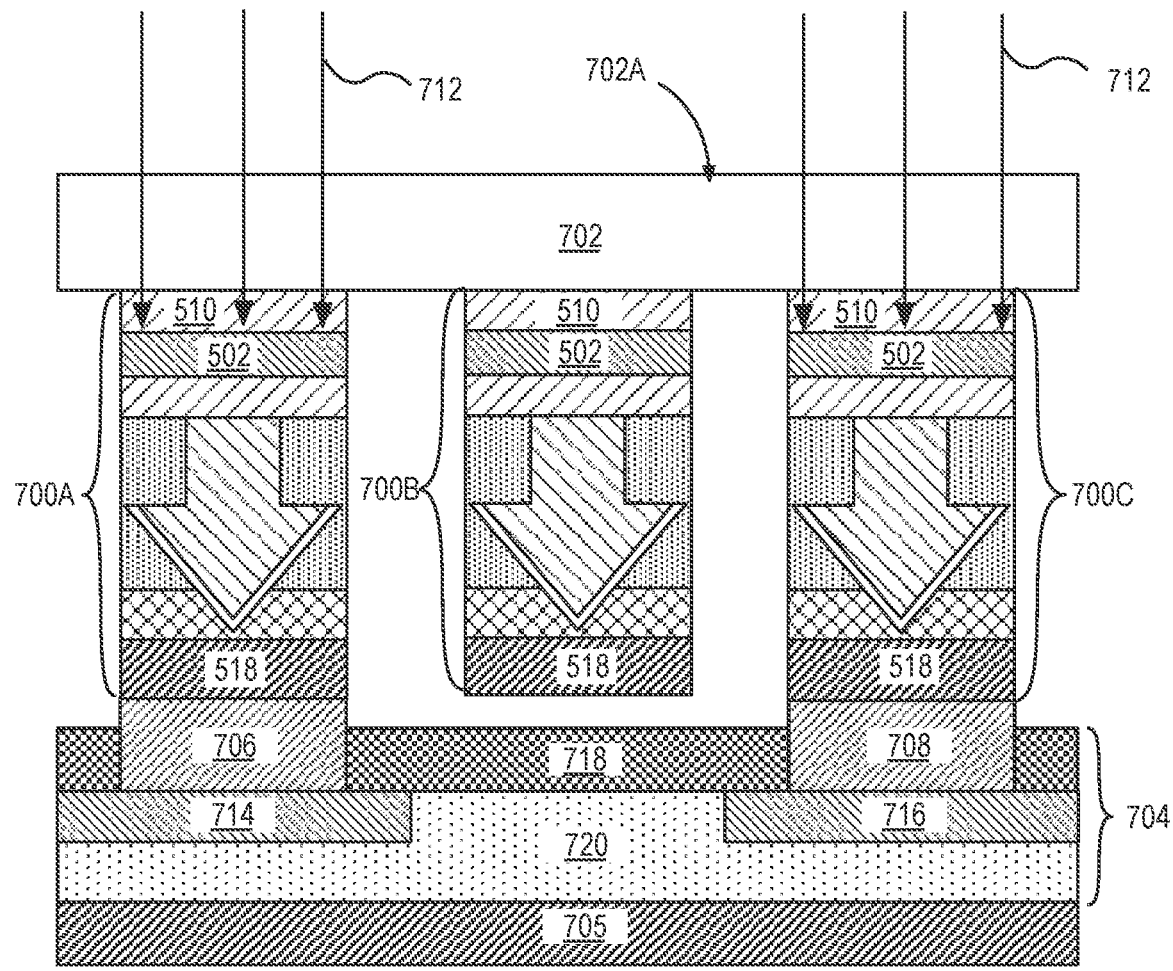
FIG. 7A is a cross-sectional illustration of a plurality of inverted LED devices of a first substrate bonded with a transistor matrix of a second substrate, and following a process to perform selective laser ablation, in accordance with an embodiment of the present disclosure.

FIG. 7A is a cross-sectional illustration of a plurality of inverted micro-LED devices 700A, 700B and 700C attached to a substrate 702 following a process to bond selected micro-LEDs on to a transistor matrix 704, in accordance with an embodiment of the present disclosure. In an embodiment, the substrate 702 includes a material that is the same or substantially the same as the material of the substrate 512. In an embodiment, the micro-LED devices 700A, 700B and 700C include one or more features of the micro-LED device 500A such as release layer 502 and electrode layer 518.

As shown, micro-LED devices 700A and 700C are bonded to electrode structures 706 and 708, respectively of the transistor matrix 704. The process of aligning and bonding is substantially the same as the process described above. In an embodiment, the bonding of micro-LEDs is performed by thermocompression bonding (TCB) or fusion bonding. In the illustrative embodiment, only micro-LED devices 700A and 700C are bonded to electrode structures 706 and 708 and Micro-LED device 700B is not above an electrode structure.

After the bonding process, a process of laser irradiation is performed. The laser beam 712 may be rastered onto a back surface 702A of the substrate 702. The process of laser irradiation is as described above. In an embodiment, the laser irradiation process is repeated over the substrate 702 to selectively release each desired micro-LED.

In the illustrative embodiment, the transistor matrix 704 includes reflective plates 714 and 716. The reflective plates 714 and 716, respectively are below electrodes 706 and 708, respectively. The reflective plates 714 and 716 are utilized for reflecting light from micro-LED devices 700A and 700C. In the illustrative embodiment, the transistor matrix 704 includes a dielectric 718 and 720.

Figure 7B:
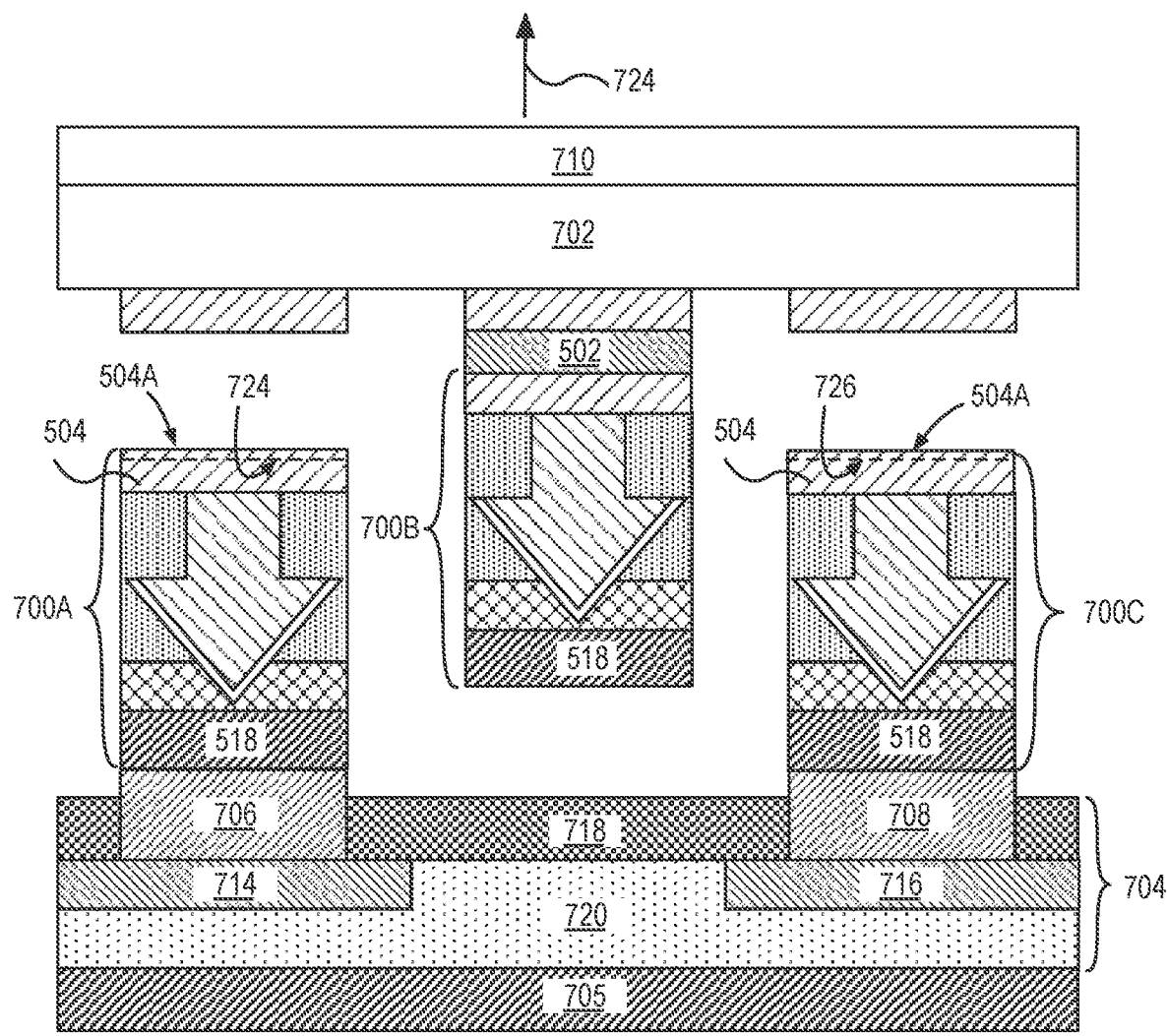
FIG. 7B is a cross-sectional illustration of the structure in FIG. 7A following the process of selective laser ablation to selectively release two of the plurality of LED devices from the first substrate.

FIG. 7B is a cross-sectional illustration of the structure in FIG. 7A after laser irradiation is completed. In the illustrative embodiment, the release layer 502 is removed from the micro-LED devices 700A and 700B as a result of laser irradiation. As shown micro-LED devices 700A and 700B are affixed to the host substrate 705. In the illustrative embodiment, the micro-LED device 700B is not removed and is affixed to substrate 702. The substrate 702, buffer layers 510, and the micro-LED device 700B are raised and removed as indicated by arrow 724.

While the release layer 502 is removed, an upper portion of devices 700A and 700C may include trace amount of one more transition metals diffused during the laser ablation process.

In the illustrative embodiment, an upper portion of the seed layer 504 (above dashed line 724 and below surface 504A in the device 700A may include trace amount of one more transition metals, such as Ta, Ti, Nb, W or Mo. Also as shown, an upper portion of the seed layer 504 (above dashed line 726 and below surface 504A in the device 700C may include trace amount of one more transition metals, such as Ta, Ti, Nb, W or Mo.

In another application of selective laser irradiation process, devices that are connected to a substrate by a group III-V compound semiconductor material may be released from a non-silicon substrate and transferred to a silicon host carrier. Silicon substrates have been utilized as a platform for realizing compact photonic integrated circuits (PICs). Silicon has a high refractive-index and permits confinement of an optical field thereby increasing light-matter interaction in a compact space. Such properties of silicon may be important for realizing efficient modulators and highspeed detectors.

In one application, silicon-photonics has relied on external laser sources to feed an optical chip through optical fiber. In a second application, a flip-chip process is utilized to integrate large number (such as greater than 3000) laser diode stacks from 3" size indium phosphide (InP) wafers onto silicon substrates. The former approach presents issue arising from applicability to high volume manufacturing and the latter involves polishing brittle InP wafers and consumes time and resources. As the number of laser diode stacks to be transferred increases to 20,000 dies per wafer, more effective transfer processes that are accurate, fast and cost-effective are highly advantageous and desirable.

A transfer process based on ablating a III-V compound semiconductor within a laser diode III-V epi stack post bonding and selective laser release is highly advantageous. In an embodiment, laser diode stacks (on a source InP wafer) are selectively bonded to a host silicon photonics wafer using fusion oxide-to-oxide bonding or thermocompression bonding (TCB). Infrared laser irradiation on to a side opposite to the side including the laser diode may be performed to selectively de-bond laser diode stacks from the source InP wafer. In a second embodiment, an entire III-V epi stack may be first transferred to a host carrier and the III-V epi stack processed into individual laser diode stacks.

Figure 8:
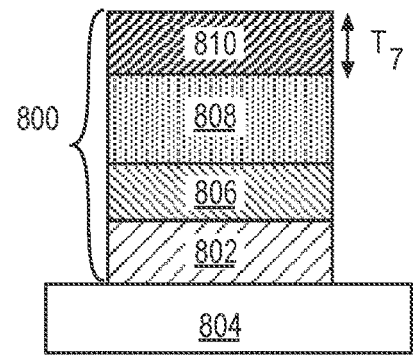
FIG. 8 is a cross-sectional illustration of a laser diode device including a layer of release III-V material.

FIG. 8 is a cross-sectional illustration of a epitaxial multilayer stack 800, in accordance with an embodiment of the present disclosure. The epitaxial multilayer stack 800 includes a first layer 802 including a group III-V ternary or a quaternary alloy material (herein III-V alloy layer) on a substrate 804, a second layer 806 including a protective layer 806. The protective layer 806 is on the first layer 802, a laser diode stack 808 on the second layer 806, a fourth layer 810 including a dielectric material on the laser diode stack 808.

The III-V alloy layer 802 is a suitable material that can efficiently absorb infrared laser radiation between 1500 nm and 1700 nm. In an embodiment, the III-V alloy layer 802 includes In, Ga, and As. In some embodiments, the III-V alloy layer 802 has a thickness between 10 nm an 30 nm.

In an embodiment, the protective layer 806 is a suitable material that can provide protection to the laser 808 during an ablation process. In an embodiment, the second layer 806 includes In an embodiment, the protective layer 806 includes a III-V material different from the III-V material in III-V alloy layer 802. The protective layer 806 may include one or more or In, Al, N, Ga, As and act as a buffer layer for the materials of the layer 808. The protective layer 806 is a material chosen to not absorb laser radiation having a wavelength between 1500 nm and 1700 nm.

In an embodiment, the laser diode stack 808 includes a multi-quantum well vertical p-i-n diode stack. In an embodiment, the epitaxial multilayer stack 800 has a lateral width that is in the range of 4 microns-10 microns. In other embodiments, the laser diode stack 808 is a patterned laser diode device 808.

In an embodiment, the dielectric material 810 includes a material that is suitable for bonding with a dielectric material in a secondary host substrate 901. In an embodiment, the dielectric material 810 includes silicon and one or more of oxygen, carbon or nitrogen (such as, for example silicon oxide, silicon dioxide, silicon carbide, silicon nitride, silicon oxynitride). The dielectric material 810 has a thickness, $T_7$, in the range of 1 nm-5 nm.

In an embodiment, the substrate 804 includes a material that is transparent to an infrared laser radiation in the range of 1500 nm and 1700 nm. In an exemplary embodiment, substrate 804 includes InP.

Figure 9A:
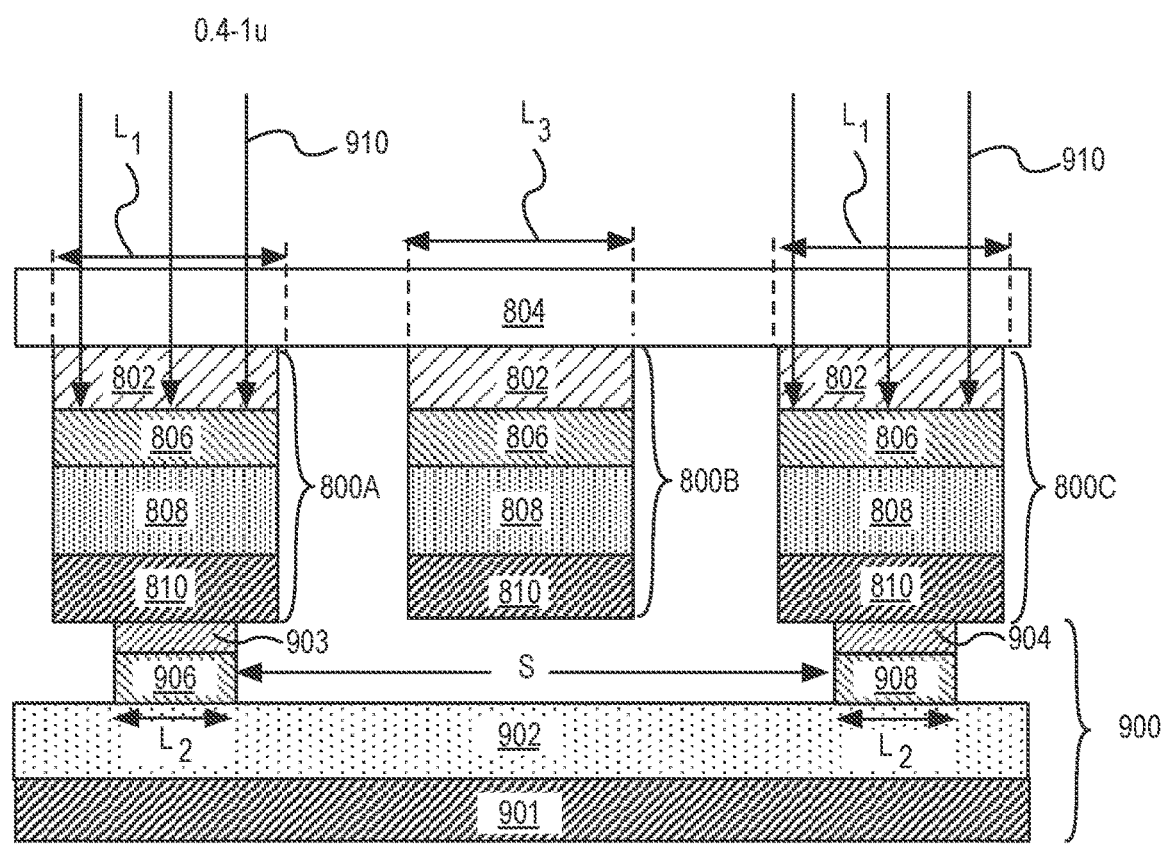
FIG. 9A is a cross-sectional illustration of laser beam directed on to a first substrate including a plurality of inverted laser diode devices attached to the first substrate by a layer of a III-V material, where a selected number of inverted laser diode devices are in contact with wave guide pads on a second substrate, in accordance with an embodiment of the present disclosure.

FIG. 9A is a cross-sectional illustration of a plurality of inverted epitaxial multilayer stack attached to a substrate 804 following a process to bond selected epitaxial multilayer stack 800 on to waveguide array 900, in accordance with an embodiment of the present disclosure. The waveguide array in above a substrate 901. In an embodiment, substrate 901 includes silicon. The waveguides 906 and 908 are formed from a relatively thin silicon that ranges between 10 nm and 100 nm in thickness. As shown the waveguides 906 and 908 are on a buried oxide 902. In the illustrative embodiment, substrate 804 includes three laser diode assemblies 800A, 800B and 800C. The laser diode assemblies 800A, 800B and 800C are substantially the same and have one or more features of the laser diode device 800 described above.

As shown, epitaxial multilayer stack 800A and epitaxial multilayer stack 800C are bonded to dielectric pads 903 and 904, respectively of the waveguide array 900. In some embodiments, the dielectric pads 903 and 904 are ultra-thin oxides that are formed on the waveguides 906 and 908, respectively. The process of aligning and bonding devices 800A and 800C onto the waveguides 906 and 908, respectively, is as described above. In an embodiment, the bonding of epitaxial multilayer stack 800C is performed by thermocompression bonding (TCB) or fusion oxide-to-oxide bonding. In the illustrative embodiment, epitaxial multilayer stack 800A and epitaxial multilayer stack 800C are bonded to dielectric pads 903 and 904, respectively and epitaxial multilayer stack 800B is not above a dielectric pad. The dielectric 810 in epitaxial multilayer stack 800A and in 800C bond with the dielectric 903 and dielectric 904, respectively. In an embodiment, the thickness of the oxide pads 903 and 904 are in the range of a few monolayers to 1 nm.

It is to be appreciated that laser diode stacks 800A and 800C may have a lateral dimension $L_1$ that is substantially greater than lateral dimensions, $L_2$ of the waveguides 906 and 908 respectively. Furthermore, the laser 800B has a lateral dimension, $L_3$, that is substantially less than a spacing, $S_1$, between the waveguides 906 and 908, as shown. In an embodiment, each of the waveguides 906 and 908 have a lateral dimension, $L_2$, that is between 400 nm-1000 nm.

After the bonding process, a process of laser irradiation is performed. In the illustrative embodiment, laser beam 910 selectively irradiates the substrate 804 at a localized region above the device 800A and is rastored. In exemplary embodiments, wavelength of the laser beam 910 is between 1500 nm and 1700 nm. A laser beam 910 having a wavelength between 1500 nm and 1700 nm is transparent to InP but may be suitable absorbed by the III-V alloy layer 802 in the device 800A. The laser irradiation includes pulses of light with duration of 1 picosecond to 10 picoseconds, and energy per pulse between 1 micro Joules and 5 micro Joules. The III-V layer 802 in the device 800A absorbs the laser irradiation and is ablated. The laser beam 910 is then moved to a new location above device 800C and the laser irradiation process is repeated. The III-V layer 802 in the device 800C absorbs the laser irradiation and is ablated.

Figure 9B:
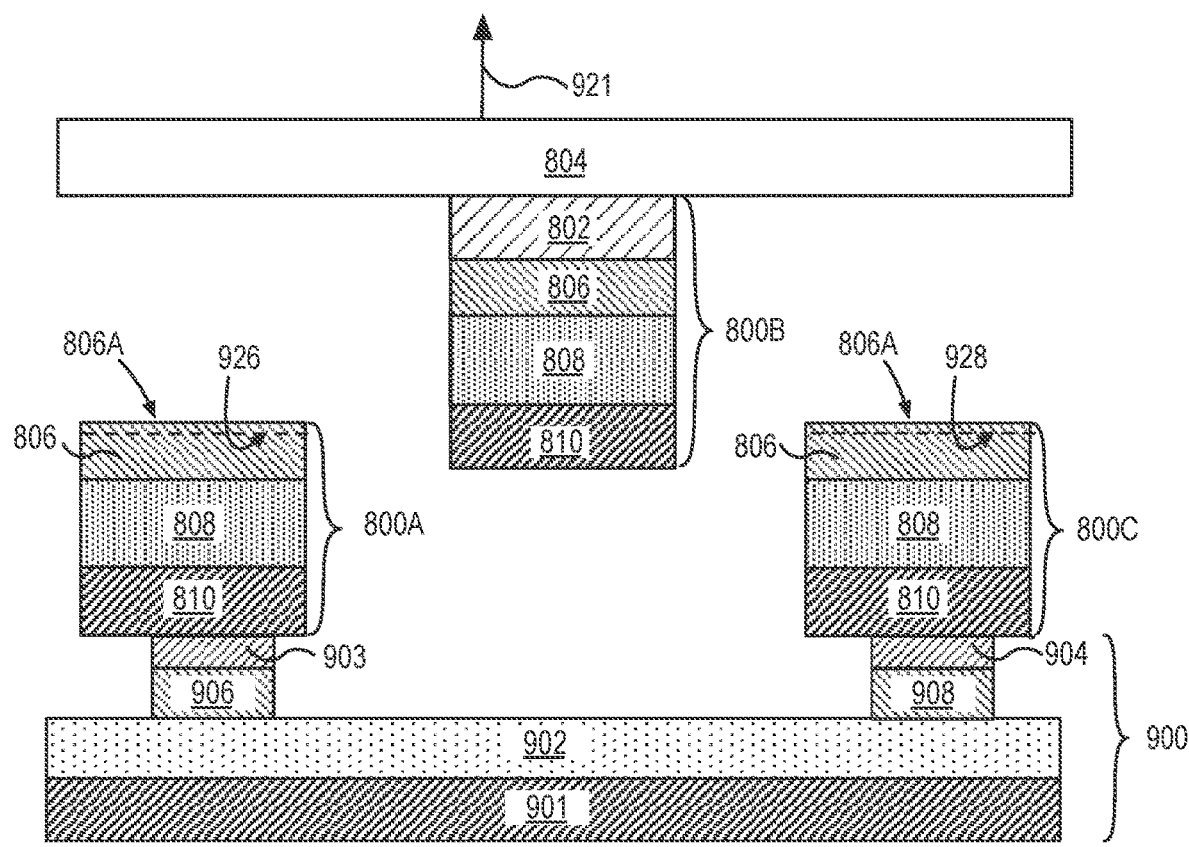
FIG. 9B is a cross-sectional illustration of the structure in FIG. 8A following the process of selective laser ablation to selectively remove the 1 III-V material and release two of the plurality of inverted laser diode devices.

FIG. 9B is a cross-sectional illustration of the structure in FIG. 9A after laser irradiation is completed. In the illustrative embodiment, the III-V alloy layer 802 is ablated and removed from epitaxial multilayer stack 800A and from epitaxial multilayer stack 800C by selective laser irradiation. As shown epitaxial multilayer stack 800A and epitaxial multilayer stack 800C are affixed to the host substrate 901. In the illustrative embodiment, there is an air gap between the buried oxide 902 and the dielectric material 810 in each of the epitaxial multilayer stacks 800A and 800C.

In the illustrative embodiment, the epitaxial multilayer stack 800B is not removed and is affixed to substrate 804. The substrate 804 and the epitaxial multilayer stack 800B are raised and removed as indicated by arrow 921.

In the illustrative embodiment, an upper portion of the protection layer 806 (above dashed line 926 and below surface 806A of device 800A may include trace amounts of one more of In, Ga or As. Also as shown, an upper portion of the protection layer 806 (above dashed line 928 and below surface 806A of device 800C may include trace amount of one more of In, Ga or As.

Thus, embodiments of the present invention include a III-N release layer multichip modules and methods of device fabrication, where each device within the multichip modules include a release layer.

In a first example, a device includes a layer including a first III-Nitride (III-N) material, a channel layer including a second III-N material, a release layer including nitrogen and a metal, where the release layer is between the first III-N material and the second III-N material. The device further includes a polarization layer including a third III-N material above the release layer, a gate structure above the polarization layer, a source structure and a drain structure on opposite sides of the gate structure where the source structure and the drain structure each include a fourth III-N material. The device further includes a source contact on the source structure and a drain contact on the drain structure.

In second examples, for any of first examples, the metal comprises Ta, Ti, Nb, Nb, W or Mo.

In third examples, for any of the first through second examples, the metal is a first metal and the release layer further comprises a ternary compound comprising the first metal and a second metal, the second metal different from the first metal, wherein the second metal comprises Ta, Ti, Nb, Nb, W or Mo.

In fourth examples, for any of the first through third examples, the release layer has a thickness between 10 nm and 100 nm.

In fifth examples, for any of the first through fourth examples, the first III-N material comprises aluminum and nitrogen.

In sixth examples, for any of the first through fifth examples, the second III-N material comprises nitrogen and at least one of Al, Ga or In and the polarization layer comprises nitrogen comprises nitrogen and at least one of Al, Ga or In, wherein the second III-N material is different from the polarization layer.

In seventh examples, for any of the first through sixth examples, the second III-N material is Ga-Polar or N-Polar.

In eighth examples, for any of the first through seventh examples, the device is a first device and where a second device is coupled above the first device. The second device comprises a second channel layer comprising a fifth III-N material, a second polarization layer below the second channel layer, the second polarization layer comprising a sixth III-N material, a second gate structure below the second polarization layer, a second source structure and a second drain structure on opposite sides of the second gate structure, the second source structure and the second drain structure each comprising a seventh III-N material, a second source contact on the second source structure, a second drain contact on the second drain structure and a dielectric between the first device and the second device, wherein the first device is electrically coupled with the second device through the dielectric.

In ninth examples, for any of the first through eighth examples, the second channel layer is Ga-Polar and the first channel layer is N-Polar or wherein the second channel layer is N-Polar and the first channel layer is Ga-Polar.

In tenth examples, for any of the first through ninth examples, an upper portion of the second channel layer comprises trace elements of the material comprising the alloy layer.

In an eleventh example, a device comprises a release layer comprising nitrogen and a metal, a layer comprising a first III-Nitride (III-N) material on the release layer, a dielectric on a portion of the layer comprising the first III-N material, a compound semiconductor structure comprising a second III-N material adjacent to the layer comprising the first III-N material. The compound semiconductor structure comprises a first portion comprising a first sidewall and a second sidewall, wherein the first sidewall and the second sidewall are each adjacent to the dielectric and a second portion, connected to the first portion, wherein the second portion has a lateral dimension that is greater than a lateral dimension of the first portion.

In twelfth examples, for any of the eleventh examples, the second portion comprises a pyramid structure having faceted sidewall, and wherein a portion of a lower surface of the pyramid structure is on the dielectric.

In thirteenth examples, for any of the eleventh through twelfth examples, the layer comprising the first III-N material has a first III-N semiconductor material portion and a second III-N material portion, wherein the first sidewall is directly adjacent the first III-N material portion and the second sidewall is directly adjacent the second III-N material portion, and wherein the first portion of the compound semiconductor structure is on the alloy layer.

In a fourteenth example, for any of the eleventh through thirteenth examples, the first portion of the compound semiconductor structure is on the layer comprising the first III-N semiconductor material.

In fifteenth examples, for any of the eleventh through fourteenth examples, the first portion of the compound semiconductor structure is on the layer comprising the first III-N material.

In sixteenth examples, for any of the eleventh through fifteenth examples, wherein the first portion of the compound semiconductor further comprises a trilayer stack, wherein the trilayer stack comprises a first layer comprising the second III-N material, second layer on the first layer, the second layer comprising a polarity inversion layer, wherein the polarity conversion layer comprises two or more of Mg, N, Al or O and a third layer on the second layer, the third layer comprising the second III-N material.

In seventeenth examples, a method of fabricating a stacked device structure comprises forming a device, where the forming comprises forming a layer comprising a first III-Nitride (III-N) material above a first substrate. The method further includes forming a release layer comprising nitrogen and a metal on the first III-N material and forming a first dielectric on the layer comprising the first III-N material. The method further includes forming an opening in the first dielectric and forming a compound semiconductor structure comprising a second III-N semiconductor material in the opening. The method further includes forming a forming a second dielectric on the compound semiconductor structure and forming a conductive layer on the second dielectric. The method further includes receiving a work piece comprising an optical interconnect structure above a second substrate, inverting the first device to form an inverted device and bonding the inverted device onto the optical interconnect structure, rastering a laser beam onto the inverted device through the first substrate and ablating the release layer, and removing the first layer from above the inverted device.

In eighteenth examples, for any of the seventeenth examples, the compound semiconductor is formed on the release layer, and wherein restoring the laser beam causes ablation of release layer and diffusion of elements of the release layer into an upper most surface compound semiconductor structure.

In nineteenth examples, for any of the seventeenth through eighteenth examples, the laser has a wavelength between 1500 nm and 3000 nm, wherein the first substrate comprises silicon and wherein the silicon is transparent to laser having a wavelength between 1500 nm and 3000 nm.

In twentieth examples, for any of the seventeenth through nineteenth examples, ablating the release layer comprises rastering a laser beam, where the laser beam has a wavelength between 1500 nm and 3000 nm, a pulse between 100 femto-seconds and 10 picoseconds and an energy between 1 micro Joule and 10 micro Joules.

What is claimed is:

1. An integrated circuit (IC) device, comprising:
a substrate having a first bandgap;
a chiplet over the substrate, wherein the chiplet comprises a Group III-Nitride (III-N) material layer and one or more transistors or diodes over the III-N material layer; and
a chiplet release layer spanning an interface of the chiplet and the substrate, wherein the chiplet release layer comprises a transition metal, and has a larger bandgap than that of the substrate.

2. The IC device of claim 1, wherein the substrate, and chiplet release layer are crystalline, and crystallinity of the chiplet release layer is epitaxial to crystallinity of the substrate.

3. The IC device of claim 2, wherein the chiplet comprises the chiplet release layer and the III-N material layer is continuous over an entirety of the chiplet release layer, and the transistors or diodes comprise electrodes over the III-N material layer.

4. The IC device of claim 3, wherein the chiplet release layer comprises a compound of nitrogen, and the transition metal comprises Ta, Ti, Nb, W, or Mo.

5. The IC device of claim 4, wherein the chiplet release layer comprises two transition metals.

6. The IC device of claim 1, wherein the chiplet release layer has a thickness between 10 nm and 100 nm.

7. The IC device of claim 1, wherein the chiplet comprises a first III-N material layer and the substrate comprises a second III-N material layer, and wherein the chiplet release layer is between the first and the second III-N material layers.

8. The IC device of claim 7, wherein the substrate further comprises a crystalline silicon or sapphire layer, and wherein the second III-N material layer is between the chiplet release layer and the crystalline silicon or sapphire layer.

9. The IC device of claim 7, wherein the second III-N material layer comprises $Al_zGa_{1-z}N$, or $Al_wIn_{1-w}N$.

10. The IC device of claim 7, wherein the first III-N material layer comprises nitrogen and at least Ga.

11. The IC device of claim 7, further comprising a third III-N material between the first III-N material and the chiplet release layer, wherein the third III-N material comprises predominantly Al and nitrogen.

12. The IC device of claim 1, wherein:
the one or more transistors or diodes comprise:
a gate structure over the III-N material layer;
a source structure and a drain structure on opposite sides of the gate structure, wherein each of the source structure and the drain structure comprise a III-N material;
a source contact on the source structure; and
a drain contact on the drain structure; and
the chiplet comprises a dielectric material layer over the one or more transistors or diodes, the dielectric material layer continuous over an entirety of the chiplet.

13. An integrated circuit (IC) device, comprising:
a substrate having a first bandgap; and
a plurality of chiplets over the substrate, wherein:
each of the chiplets comprises a Group III-Nitride (III-N) material layer and one or more transistors or diodes over the III-N material layer;
each of the chiplets comprises a crystalline chiplet release layer between the III-N material layer and the substrate; and
the chiplet release layer comprises a transition metal and nitrogen, and has a larger bandgap than that of the substrate.

14. The IC device of claim 13, wherein the III-N material layer is a first III-N material layer and each of the chiplets further comprises a buffer layer in contact with the chiplet release layer, and wherein the buffer layer comprises a second III-N material layer.

15. The IC device of claim 13, wherein the III-N material layer is continuous over an entirety of the chiplet release layer.

16. The IC device of claim 13, wherein the chiplet release layer comprises a compound of nitrogen, and the transition metal comprises Ta, Ti, Nb, W, or Mo.

17. The IC device of claim 13, wherein the one or more transistors or diodes comprise a light emitting diode (LED).

* * * * *